(12) United States Patent
Brown Elliott et al.

(10) Patent No.: US 7,505,053 B2
(45) Date of Patent: *Mar. 17, 2009

(54) SUBPIXEL LAYOUTS AND ARRANGEMENTS FOR HIGH BRIGHTNESS DISPLAYS

(75) Inventors: Candice Hellen Brown Elliott, Vallejo, CA (US); Thomas Lloyd Credelle, Morgan Hill, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 805 days.

This patent is subject to a terminal disclaimer.

(21) Appl. No.: 10/961,506

(22) Filed: Oct. 7, 2004

(65) Prior Publication Data

US 2005/0225575 A1    Oct. 13, 2005

Related U.S. Application Data

(63) Continuation-in-part of application No. 10/821,353, filed on Apr. 9, 2004.

(51) Int. Cl.
*G09G 5/02*    (2006.01)
(52) U.S. Cl. ...................... 345/694; 345/695
(58) Field of Classification Search ................. 345/102, 345/694, 695, 698
See application file for complete search history.

(56) References Cited

U.S. PATENT DOCUMENTS

| | | | |
|---|---|---|---|
| 4,632,514 A | 12/1986 | Ogawa et al. | |
| 4,642,619 A | 2/1987 | Togashi | |
| 5,006,840 A | 4/1991 | Hamada et al. | |
| 5,113,274 A | 5/1992 | Takahashi et al. | |
| 5,311,205 A | 5/1994 | Hamada et al. | |
| 5,341,153 A | 8/1994 | Benzschawel et al. | |
| 5,398,066 A | 3/1995 | Martinez-Uriegas et al. | |
| 5,461,503 A | 10/1995 | Deffontaines et al. | |
| 5,485,293 A | 1/1996 | Robinder | |
| 5,757,452 A * | 5/1998 | Masaki et al. | 349/110 |
| 5,808,594 A * | 9/1998 | Tsuboyama et al. | 345/89 |
| 5,929,843 A | 7/1999 | Tanioka | |
| 5,991,438 A | 11/1999 | Shaked et al. | |
| 6,023,315 A | 2/2000 | Harrold et al. | |
| 6,072,445 A | 6/2000 | Spitzer et al. | |
| 6,137,560 A | 10/2000 | Utsumi et al. | |
| 6,144,352 A | 11/2000 | Matsuda et al. | |
| 6,147,728 A | 11/2000 | Okumura et al. | |

(Continued)

FOREIGN PATENT DOCUMENTS

DE    199 23 527    11/2000

(Continued)

OTHER PUBLICATIONS

Betrisey, C., et al., Displaced Filtering for Patterned Displays, SID Symp. Digest 1999, pp. 296-299.

(Continued)

*Primary Examiner*—Richard Hjerpe
*Assistant Examiner*—Tom V Sheng
(74) *Attorney, Agent, or Firm*—MacPherson Kwok Chen & Heid LLP

(57) ABSTRACT

High brightness displays comprising subpixel repeating groups having at least white with a number of colored subpixels are disclosed. Colored subpixels may comprise: red, blue, green, cyan or magenta in these various embodiments.

14 Claims, 22 Drawing Sheets

U.S. PATENT DOCUMENTS

| | | | |
|---|---|---|---|
| 6,278,434 | B1 | 8/2001 | Hill et al. |
| 6,326,981 | B1 | 12/2001 | Mori et al. |
| 6,327,008 | B1 | 12/2001 | Fujiyoshi |
| 6,360,023 | B1 | 3/2002 | Betrisey et al. |
| 6,385,466 | B1 | 5/2002 | Hirai et al. |
| 6,393,145 | B2 | 5/2002 | Betrisey et al. |
| 6,396,505 | B1 | 5/2002 | Lui et al. |
| 6,469,756 | B1 | 10/2002 | Booth, Jr. |
| 6,593,981 | B1 | 7/2003 | Haim et al. |
| 6,614,414 | B2 | 9/2003 | De Haan et al. |
| 6,738,526 | B1 | 5/2004 | Betrisey et al. |
| 6,842,207 | B2 | 1/2005 | Nishida et al. |
| 6,856,704 | B1 | 2/2005 | Gallagher et al. |
| 6,897,876 | B2 | 5/2005 | Murdoch et al. |
| 6,914,649 | B2 * | 7/2005 | Liu .................. 349/109 |
| 6,930,676 | B2 | 8/2005 | De Haan et al. |
| 6,937,217 | B2 | 8/2005 | Klompenhouwer et al. |
| 6,989,876 | B2 | 1/2006 | Song et al. |
| 7,110,012 | B2 | 9/2006 | Messing et al. |
| 7,248,268 | B2 | 7/2007 | Brown Elliott et al. |
| 7,268,792 | B2 * | 9/2007 | Lee et al. ............... 345/694 |
| 2001/0048764 | A1 | 12/2001 | Betrisey et al. |
| 2002/0030780 | A1 | 3/2002 | Nishida et al. |
| 2002/0054263 | A1 | 5/2002 | Kim et al. |
| 2002/0180688 | A1 | 12/2002 | Drzaic et al. |
| 2002/0191130 | A1 | 12/2002 | Liang et al. |
| 2003/0128179 | A1 | 7/2003 | Credelle |
| 2003/0128225 | A1 | 7/2003 | Credelle et al. |
| 2004/0051724 | A1 | 3/2004 | Elliott et al. |
| 2004/0061710 | A1 | 4/2004 | Messing et al. |
| 2004/0080479 | A1 | 4/2004 | Credelle |
| 2004/0095521 | A1 | 5/2004 | Song et al. |
| 2004/0174389 | A1 | 9/2004 | Ben-David et al. |
| 2004/0195963 | A1 * | 10/2004 | Choi et al. .............. 313/504 |
| 2004/0196297 | A1 | 10/2004 | Elliott et al. |
| 2004/0239813 | A1 | 12/2004 | Klompenhouwer |
| 2004/0263528 | A1 | 12/2004 | Murdoch et al. |
| 2005/0094871 | A1 | 5/2005 | Berns et al. |
| 2005/0174363 | A1 | 8/2005 | Brown Elliott |
| 2005/0225563 | A1 | 10/2005 | Brown Elliott et al. |
| 2005/0225574 | A1 | 10/2005 | Brown Elliott et al. |
| 2007/0052887 | A1 | 3/2007 | Brown Elliott et al. |
| 2007/0057963 | A1 | 3/2007 | Brown Elliott et al. |
| 2007/0064020 | A1 | 3/2007 | Credelle et al. |
| 2007/0064162 | A1 * | 3/2007 | Yamamoto et al. .......... 348/790 |
| 2007/0070086 | A1 | 3/2007 | Brown Elliott et al. |

FOREIGN PATENT DOCUMENTS

| | | |
|---|---|---|
| EP | 0 899 604 A2 | 3/1999 |
| JP | 60-107022 | 6/1985 |
| JP | 62 127716 | 6/1987 |
| JP | 11-014978 | 1/1999 |
| JP | 2004-004822 | 1/2004 |
| WO | WO 00/42762 | 7/2000 |
| WO | WO 00/70392 | 11/2000 |
| WO | WO 02/11112 A2 | 2/2002 |
| WO | WO 2006/127555 A2 | 11/2006 |

OTHER PUBLICATIONS

Brown Elliott, C., "Active Matrix Display . . . ", IDMC 2000, 185-189, Aug. 2000.

Brown Elliott, C., "Color Subpixel Rendering Projectors and Flat Panel Displays," SMPTE, Feb. 27-Mar. 1, 2003, Seattle, WA pp. 1-4.

Brown Elliott, C, "Co-Optimization of Color AMLCD Subpixel Architecture and Rendering Algorithms," SID 2002 Proceedings Paper, May 30, 2002 pp. 172-175.

Brown Elliott, C, "Development of the PenTile Matrix™ Color AMLCD Subpixel Architecture and Rendering Algorithms", SID 2003, Journal Article.

Brown Elliott, C, "New Pixel Layout for PenTile Matrix™ Architecture", IDMC 2002, pp. 115-117.

Brown Elliott, C, "Reducing Pixel Count Without Reducing Image Quality", Information Display Dec. 1999, vol. 1, pp. 22-25.

Credelle, Thomas, "P-00: MTF of High-Resolution PenTile Matrix Displays", Eurodisplay 02 Digest, 2002 pp. 1-4.

Klompenhouwer, Michiel, Subpixel Image Scaling for Color Matrix Displays, SID Symp. Digest, May 2002, pp. 176-179.

Michiel A. Klompenhouwer, Gerard de Haan, Subpixel image scaling for color matrix displays, Journal of the Society for Information Display, vol. 11, Issue 1, Mar. 2003, pp. 99-108.

Messing, Dean et al., Improved Display Resolution of Subsampled Colour Images Using Subpixel Addressing, IEEE ICIP 2002, vol. 1, pp. 625-628.

Messing, Dean et al., Subpixel Rendering on Non-Striped Colour Matrix Displays, 2003 International Conf on Image Processing, Sep. 2003, Barcelona, Spain, 4 pages.

PCT International Search Report dated Jun. 14, 2004 for PCT/US03/028222 (U.S. Appl. No. 10/243,094).

PCT International Search Report dated Dec. 23, 2005 for PCT/US05/010023 (U.S. Appl. No. 10/961,506).

PCT International Search Report dated Dec. 18, 2006 for PCT/US06/19657 (U.S. Appl. No. 60/747,177).

EPO Search Report dated Aug. 14, 2007 for EP Application No. 05730809.0-2205 (PCT/US05/010023).

PCT International Search Report dated Apr. 4, 2002 for PCT/US01/23895 (U.S. Appl. No. 09/916,232).

PCT International Search Report dated Apr. 8, 2003 for PCT/US02/39864 (U.S. Appl. No. 10/278,353).

PCT International Search Report dated Apr. 9, 2003 for PCT/US02/39857 (U.S. Appl. No. 10/278,352).

PCT International Search Report dated Jul. 11, 2005 for PCT/US05/010022 (U.S. Appl. No. 10/821,388).

USPTO, Non-Final Office Action, dated Mar. 9, 2004 in US Patent No. 6,903,754 (U.S. Appl. No. 09/916,232).

USPTO, Non-Final Office Action, dated Mar. 6, 2004 in US Patent No. 6,903,754 (U.S. Appl. No. 09/916,232).

Clairvoyante Inc., Response to Non-Final Office Action, dated Sep. 3, 2004 in US Patent No. 6,903,754 (U.S. Appl. No. 09/916,232).

USPTO, Final Office Action, dated Jan. 6, 2005 in US Patent No. 6,903,754 (U.S. Appl. No. 09/916,232).

Clairvoyante Inc., Response to Final Office Action, dated Jan. 28, 2005 in US Patent No. 6,903,754 (U.S. Appl. No. 09/916,232).

USPTO, Notice of Allowance, dated Feb. 7, 2005 in US Patent No. 6,903,754 (U.S. Appl. No. 09/916,232).

USPTO, Non-Final Office Action, dated May 17, 2005 in US Patent Publication No. 2004/0051724, (U.S. Appl. No. 10/243,094).

Clairvoyante Inc, Response to Non-Final Office Action, dated Nov. 17, 2005 in US Patent Publication No. 2004/0051724, (U.S. Appl. No. 10/243,094).

USPTO, Final Office Action, dated Mar. 8, 2006 in US Patent Publication No. 2004/0051724, (U.S. Appl. No. 10/243).

USPTO, Non-Final Office Action, dated Nov. 16, 2004 in US Patent Publication No. 2003/0128225, (U.S. Appl. No. 10/278,353).

Clairvoyante Inc, Response to Non-Final Office Action, dated Apr. 15, 2005 in US Patent Publication No. 2003/0128225, (U.S. Appl. No. 10/278,353).

USPTO, Non-Final Office Action, dated Jul. 12, 2005 in US Patent Publication No. 2003/0128225, (U.S. Appl. No. 10/278,353).

Clairvoyante Inc, Response to Non-Final Office Action, dated Jan. 12, 2006 in US Patent Publication No. 2003/0128225, (U.S. Appl. No. 10/278,353).

USPTO, Final Office Action, dated Apr. 18, 2006 in US Patent Publication No. 2003/0128225, (U.S. Appl. No. 10/278,353).

Clairvoyante Inc, Response to Final Office Action, dated Sep. 18, 2006 in US Patent Publication No. 2003/0128225, (U.S. Appl. No. 10/278,353).

USPTO, Non-Final Office Action, dated Mar. 2, 2007 in US Patent Publication No. 2003/0128225, (U.S. Appl. No. 10/278,353).

Clairvoyante Inc, Response to Non-Final Office Action, dated Jun. 12, 2007 in US Patent Publication No. 2003/0128225, (U.S. Appl. No. 10/278,353).

USPTO, Non-Final Office Action, dated Nov. 16, 2004 in US Patent Publication No. 2003/0128179, (U.S. Appl. No. 10/278,352).

Clairvoyante Inc, Response to Non-Final Office Action, dated Apr. 15, 2005 in US Patent Publication No. 2003/0128179, (U.S. Appl. No. 10/278,352).

USPTO, Non-Final Office Action, dated Jul. 12, 2005 in US Patent Publication No. 2003/0128179, (U.S. Appl. No. 10/278,352).

Clairvoyante Inc, Response to Non-Final Office Action, dated Jan. 12, 2008 in US Patent Publication No. 2003/0128179, (U.S. Appl. No. 10/278,352).

USPTO, Final Office Action, dated Sep. 18, 2006 in US Patent Publication No. 2003/0128179, (U.S. Appl. No. 10/278,352).

Clairvoyante Inc, Response to Final Office Action, dated Dec. 6, 2006 in US Patent Publication No. 2003/0128179, (U.S. Appl. No. 10/278,352).

USPTO, Non-Final Office Action, dated Jun. 27, 2007 in US Patent Publication No. 2003/0128179, (U.S. Appl. No. 10/278,352).

Clairvoyante Inc, Response to Non-Final Office Action, dated Dec. 27, 2007 in US Patent Publication No. 2003/0128179, (U.S. Appl. No. 10/278,352).

USPTO, Non-Final Office Action dated Jul. 12, 2007 in US Patent Publication No. 2005/0225574, (U.S. Appl. No. 10/821,353).

Clairvoyante Inc, Response to Non-Final Office Action dated Jan. 14, 2008 in US Patent Publication No. 2005/0225574, (U.S. Appl. No. 10/821,353).

USPTO, Final Office Action dated Feb. 20, 2008 in US Patent Publication No. 2005/0225574, (U.S. Appl. No. 10/821,353).

Clairvoyante Inc, Response to Final Office Action dated Apr. 21, 2008 in US Patent Publication No. 2005/0225574, (U.S. Appl. No. 10/821,353).

USPTO, Advisory Action dated May 15, 2008 in US Patent Publication No. 2005/0225574, (U.S. Appl. No. 10/821,353).

Clairvoyante Inc, Response to Final Office Action dated May 20, 2008 in US Patent Publication No. 2005/0225574, (U.S. Appl. No. 10/821,353).

USPTO, Non-Final Office Action dated Aug. 2, 2005 in US Patent No. 7,248,268 (U.S. Appl. No. 10/821,388).

Clairvoyante Inc, Response to Non-Final Office Action dated Feb. 2, 2006 in US Patent No. 7,248,268 (U.S. Appl. No. 10/821,388).

USPTO, Final Office Action dated Mar. 1, 2006 in US Patent No. 7,248,268 (U.S. Appl. No. 10/821,388).

Clairvoyante Inc, Response to Final Office Action dated May 3, 2006 in US Patent No. 7,248,268 (U.S. Appl. No. 10/821,388).

USPTO, Advisory Action dated May 15, 2006 in US Patent No. 7,248,268 (U.S. Appl. No. 10/821).

Clairvoyante Inc, Response to Final Office Action dated Jul. 26, 2006 in US Patent No. 7,248,268 (U.S. Appl. No. 10/821,388).

USPTO, Advisory Action dated Aug. 4, 2006 in US Patent No. 7,248,268 (U.S. Appl. No. 10/821,388).

USPTO, Advisory Action dated Aug. 15, 2006 in US Patent No. 7,248,268 (U.S. Appl. No. 10/821,388).

Clairvoyante Inc, Appeal Brief dated Nov. 27, 2006 in US Patent No. 7,248,268 (U.S. Appl. No. 10/821,388).

Clairvoyante Inc, Response to Final Office Action dated Mar. 13, 2007 in US Patent No. 7,248,268 (U.S. Appl. No. 10/821,388).

EPO, Office Action dated Oct. 31, 2007 in EP Application No. 05730809.0-2205 (U.S. Appl. No. 10/691,506).

CN Patent Office, Office Action dated Mar. 9, 2006 in CN Application No. 200520012289.5.

\* cited by examiner

SUBPIXEL LAYOUTS AND ARRANGEMENTS FOR HIGH BRIGHTNESS DISPLAYS

The present invention is a continuation-in-part application of U.S. patent application Ser. No. 10/821,353 entitled "NOVEL SUBPIXEL LAYOUTS AND ARRANGEMENTS FOR HIGH BRIGHTNESS DISPLAYS" filed on Apr. 9, 2004, herein incorporated by reference in its entirety, and claims benefit of the priority date thereof.

BACKGROUND

In commonly owned U.S. patent applications: (1) U.S. patent application Ser. No. 09/916,232 ("the '232 application"), entitled "ARRANGEMENT OF COLOR PIXELS FOR FULL COLOR IMAGING DEVICES WITH SIMPLIFIED ADDRESSING," filed Jul. 25, 2001; (2) U.S. patent application Ser. No. 10/278,353 ("the '353 application"), entitled "IMPROVEMENTS TO COLOR FLAT PANEL DISPLAY SUB-PIXEL ARRANGEMENTS AND LAYOUTS FOR SUB-PIXEL RENDERING WITH INCREASED MODULATION TRANSFER FUNCTION RESPONSE," filed Oct. 22, 2002; (3) U.S. patent application Ser. No. 10/278,352 ("the '352 application"), entitled "IMPROVEMENTS TO COLOR FLAT PANEL DISPLAY SUB-PIXEL ARRANGEMENTS AND LAYOUTS FOR SUB-PIXEL RENDERING WITH SPLIT BLUE SUB-PIXELS," filed Oct. 22, 2002; (4) U.S. patent application Ser. No. 10/243,094 ("the '094 application), entitled "IMPROVED FOUR COLOR ARRANGEMENTS AND EMITTERS FOR SUB-PIXEL RENDERING," filed Sep. 13, 2002; (5) U.S. patent application Ser. No. 10/278,328 ("the '328 application"), entitled "IMPROVEMENTS TO COLOR FLAT PANEL DISPLAY SUB-PIXEL ARRANGEMENTS AND LAYOUTS WITH REDUCED BLUE LUMINANCE WELL VISIBILITY," filed Oct. 22, 2002; (6) U.S. patent application Ser. No. 10/278,393 ("the '393 application"), entitled "COLOR DISPLAY HAVING HORIZONTAL SUB-PIXEL ARRANGEMENTS AND LAYOUTS," filed Oct. 22, 2002; (7) U.S. patent application Ser. No. 01/347,001 ("the '001 application") entitled "IMPROVED SUB-PIXEL ARRANGEMENTS FOR STRIPED DISPLAYS AND METHODS AND SYSTEMS FOR SUB-PIXEL RENDERING SAME," filed Jan. 16, 2003, each of which is herein incorporated by reference in its entirety, novel sub-pixel arrangements are disclosed for improving the cost/performance curves for image display devices.

For certain subpixel repeating groups having an even number of subpixels in a horizontal direction, the following systems and techniques to affect improvements, e.g. proper dot inversion schemes and other improvements, are disclosed and are herein incorporated by reference in their entirety: (1) U.S. patent application Ser. No. 10/456,839 entitled "IMAGE DEGRADATION CORRECTION IN NOVEL LIQUID CRYSTAL DISPLAYS"; (2) U.S. patent application Ser. No. 10/455,925 entitled "DISPLAY PANEL HAVING CROSS-OVER CONNECTIONS EFFECTING DOT INVERSION"; (3) U.S. patent application Ser. No. 10/455,931 entitled "SYSTEM AND METHOD OF PERFORMING DOT INVERSION WITH STANDARD DRIVERS AND BACKPLANE ON NOVEL DISPLAY PANEL LAYOUTS"; (4) U.S. patent application Ser. No. 10/455,927 entitled "SYSTEM AND METHOD FOR COMPENSATING FOR VISUAL EFFECTS UPON PANELS HAVING FIXED PATTERN NOISE WITH REDUCED QUANTIZATION ERROR"; (5) U.S. patent application Ser. No. 10/456,806 entitled "DOT INVERSION ON NOVEL DISPLAY PANEL LAYOUTS WITH EXTRA DRIVERS"; (6) U.S. patent application Ser. No. 10/456,838 entitled "LIQUID CRYSTAL DISPLAY BACKPLANE LAYOUTS AND ADDRESSING FOR NON-STANDARD SUBPIXEL ARRANGEMENTS"; (7) U.S. patent application Ser. No. 10/696,236 entitled "IMAGE DEGRADATION CORRECTION IN NOVEL LIQUID CRYSTAL DISPLAYS WITH SPLIT BLUE SUBPIXELS", filed Oct. 28, 2003; and (8) U.S. patent application Ser. No. 10/807,604 entitled "IMPROVED TRANSISTOR BACKPLANES FOR LIQUID CRYSTAL DISPLAYS COMPRISING DIFFERENT SIZED SUBPIXELS", filed Mar. 23, 2004.

These improvements are particularly pronounced when coupled with sub-pixel rendering (SPR) systems and methods further disclosed in those applications and in commonly owned U.S. patent applications: (1) U.S. patent application Ser. No. 10/051,612 ("the '612 application"), entitled "CONVERSION OF RGB PIXEL FORMAT DATA TO PENTILE MATRIX SUB-PIXEL DATA FORMAT," filed Jan. 16, 2002; (2) U.S. patent application Ser. No. 10/150,355 ("the '355 application"), entitled "METHODS AND SYSTEMS FOR SUB-PIXEL RENDERING WITH GAMMA ADJUSTMENT," filed May 17, 2002; (3) U.S. patent application Ser. No. 10/215,843 ("the '843 application"), entitled "METHODS AND SYSTEMS FOR SUB-PIXEL RENDERING WITH ADAPTIVE FILTERING," filed Aug. 8, 2002; (4) U.S. patent application Ser. No. 10/379,767 entitled "SYSTEMS AND METHODS FOR TEMPORAL SUB-PIXEL RENDERING OF IMAGE DATA" filed Mar. 4, 2003; (5) U.S. patent application Ser. No. 10/379,765 entitled "SYSTEMS AND METHODS FOR MOTION ADAPTIVE FILTERING," filed Mar. 4, 2003; (6) U.S. patent application Ser. No. 10/379,766 entitled "SUB-PIXEL RENDERING SYSTEM AND METHOD FOR IMPROVED DISPLAY VIEWING ANGLES" filed Mar. 4, 2003; (7) U.S. patent application Ser. No. 10/409,413 entitled "IMAGE DATA SET WITH EMBEDDED PRE-SUBPIXEL RENDERED IMAGE" filed Apr. 7, 2003, which are hereby incorporated herein by reference in their entirety.

Improvements in gamut conversion and mapping are disclosed in commonly owned and co-pending U.S. patent applications: (1) U.S. patent application Ser. No. 10/691,200 entitled "HUE ANGLE CALCULATION SYSTEM AND METHODS", filed Oct. 21, 2003; (2) U.S. patent application Ser. No. 10/691,377 entitled "METHOD AND APPARATUS FOR CONVERTING FROM SOURCE COLOR SPACE TO RGBW TARGET COLOR SPACE", filed Oct. 21, 2003; (3) U.S. patent application Ser. No. 10/691,396 entitled "METHOD AND APPARATUS FOR CONVERTING FROM A SOURCE COLOR SPACE TO A TARGET COLOR SPACE", filed Oct. 21, 2003; and (4) U.S. patent application Ser. No. 10/690,716 entitled "GAMUT CONVERSION SYSTEM AND METHODS" filed Oct. 21, 2003 which are all hereby incorporated herein by reference in their entirety.

Additional advantages have been described in (1) U.S. patent application Ser. No. 10/696,235 entitled "DISPLAY SYSTEM HAVING IMPROVED MULTIPLE MODES FOR DISPLAYING IMAGE DATA FROM MULTIPLE INPUT SOURCE FORMATS", filed Oct. 28, 2003 and (2) U.S. patent application Ser. No. 10/696,026 entitled "SYSTEM AND METHOD FOR PERFORMING IMAGE RECONSTRUCTION AND SUBPIXEL RENDERING TO EFFECT SCALING FOR MULTI-MODE DISPLAY" filed Oct. 28, 2003.

Additionally, these co-owned and co-pending applications are herein incorporated by reference in their entirety: (1) U.S.

patent application Ser. No. PCT/US05/09532 entitled "SYSTEM AND METHOD FOR IMPROVING SUB-PIXEL RENDERING OF IMAGE DATA IN NON-STRIPED DISPLAY SYSTEMS"; (2) U.S. patent application Ser. No. 11/873,221 entitled "SYSTEMS AND METHODS FOR SELECTING A WHITE POINT FOR IMAGE DISPLAYS"; (3) U.S. patent application Ser. No. 10/821,306 entitled "SYSTEMS AND METHODS FOR IMPROVED GAMUT MAPPING FROM ONE IMAGE DATA SET TO ANOTHER"; (4) U.S. patent application Ser. No. 11/780,898 entitled "IMPROVED SUBPIXEL RENDERING FILTERS FOR HIGH BRIGHTNESS SUBPIXEL LAYOUTS"; which are all hereby incorporated by reference. All patent applications mentioned in this specification are hereby incorporated by reference in their entirety.

BRIEF DESCRIPTION OF THE DRAWINGS

The accompanying drawings, which are incorporated in, and constitute a part of this specification illustrate exemplary implementations and embodiments of the invention and, together with the description, serve to explain principles of the invention.

DETAILED DESCRIPTION

Figure 1:
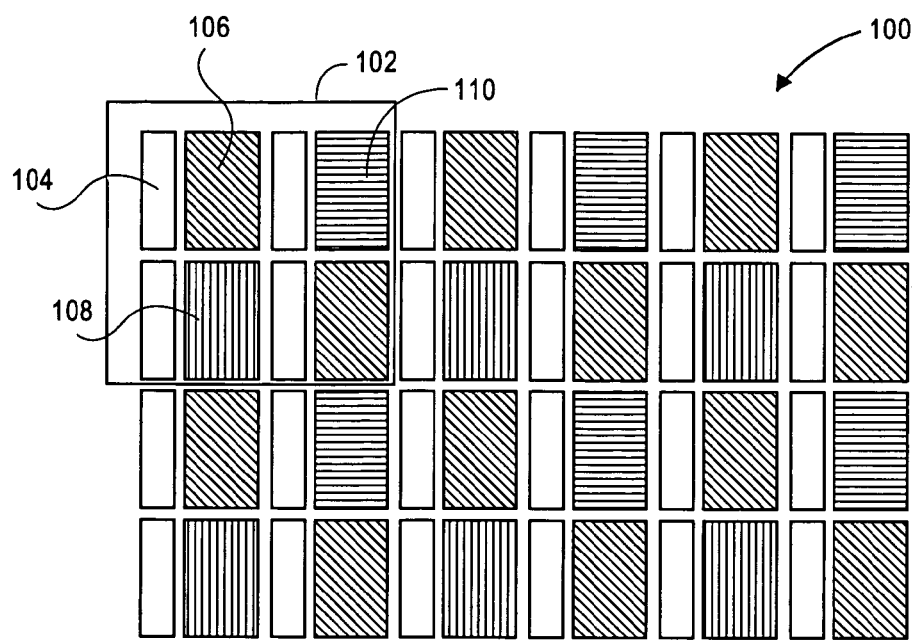
FIGS. 1 through 4 are several embodiments of high brightness layouts as made in accordance with the principles of the present invention.

Reference will now be made in detail to implementations and embodiments, examples of which are illustrated in the accompanying drawings. Wherever possible, the same reference numbers will be used throughout the drawings to refer to the same or like parts.

RGBW Color Liquid Crystal Displays and Natural Images

The "real world" is a subtractive color system. Save for relatively rare emissive light sources such as LEDs and lasers, high brightness saturated colors are not found in real world scenes that are viewed by the human vision system in the course of an individual going about his or her daily life. In daily experience, colors are formed by relatively bright white light falling onto pigmented objects that absorb some portion of the light and reflecting the rest. Colors are formed by selectively absorbing part of the spectrum and reflecting another part of the spectrum. Non-color-saturated objects such as white or pastel colored objects may substantially reflect most of the light, thus being radiometrically and visually brighter than saturated color objects. Conversely, objects that form saturated colors absorb most of the light and reflect only a narrow band (or bands in the case of purple or magenta) of the full spectrum of light falling on it. This reduces the brightness of saturated colored objects compared to non-saturated color objects. This is especially true for saturated colors that are near the corners of the color triangle of red, green, and blue, as to achieve these colors, the light must be in very narrow wavelength bands. Further, specular reflections occur at the surfaces of objects which do not substantially alter the spectrum of light falling on them, giving reflection highlights that are non-color-saturated, even on objects that are observed to be highly color-saturated in lambertian reflection. These highlights are the brightest portions of many natural scenes (e.g. the mirror like reflection of an overhead light on a brightly colored billiard ball is white, not colored). Thus, by their very nature, real world scenes may have bright non-color-saturated objects and darker color-saturated objects.

Some natural images have highly saturated colors. In these images, the brightest red, green, and blue colors are far darker than the white found in natural images. Even yellow, which may be formed from a mixture of red and green—may not be as bright as white. Other images—typically photographs of indoor objects (e.g. faces)—might not have such brightly colored objects. When examining the statistical occurrence of highly saturated colors vs. non-saturated colors, one finds that saturated colors are relatively rare in natural images. When saturated colors do occur, they are quite dark. Further, given the subtractive nature of color formation in natural scenes, bright saturated colors are almost non-existent.

For electronic displays to render natural scenes, it might be best for it to be able to create very bright non-color-saturated colors and darker highly saturated colors. Upon inspection of the capabilities of the conventional three primary, RGB, system, one notes that it is a color additive system whose non-saturated color brightness is limited to the addition of partially-saturated colors. The brightness/saturation color gamut of the RGB system generally has brighter non-saturated colors, but fails to reproduce the very bright non-saturated colors.

There is a trade-off between the brightness of the non-saturated colors and the color saturation gamut of the filtered backlight display. The more saturated the color filters, the less these filtered colors may add to the non-saturated brightness. This creates a luminance/saturation compression in which the non-saturated colors are reduced in brightness and saturated colors are compressed, desaturated, to fit within the limitations of the compromise system. Another color formation system is required to better display natural images.

RGBW liquid crystal displays provide an additional primary: White. These White subpixels are substantially brighter than the Red, Green, and Blue subpixels since the White is formed by using a transparent filter that allows substantially all of the light through, while the other three colors are formed by filtering out all but a narrow band of the spectrum. Since such filters are not ideal bandpass filters, the transmissivity is less than 100% even in the desired bandpass wavelengths, which further darkens the subpixel. The White subpixel may have up to four or more times the brightness of the colored subpixels. Thus, the use of a white subpixel significantly increases the brightness of the panel when displaying non-saturated colors.

If one fourth of the area of the panel is used for the White subpixel, the brightnesses of the remaining RGB subpixels are reduced by one fourth. However, non-saturated colors may be formed with a contribution from the bright White subpixel, giving significantly higher brightness. The resulting panel has a brightness/color gamut envelope shape that is closer to that of the 'real world'. The loss of brightness of the saturated colors is an acceptable trade-off when considering the statistics of natural images. However, as the choice of conventional RGB primaries was a compromise between the desired saturation of the primaries and the brightness of non-saturated colors, the introduction of the White subpixel offers a new optimization point.

Since the White subpixel provides the majority of the brightness of non-saturated colors, the saturation of the RGB primaries may be increased with only minor decrease of brightness of the non-saturated colors. This decrease may be partially offset by increase in the aperture ratio of the 1:2 aspect ratio subpixel for some (e.g. small) panels, with its reduced horizontal subpixel density, compared to the 1:3 aspect ratio subpixel found in conventional RGB stripe displays. This may result in an RGBW display that has both increased brightness and saturation envelope at every point compared to the conventional RGB display. Fully saturated colors may be darker on the optimized RGBW system compared to the RGB system, but at the saturation maximum color points of the RGB system, the RGBW brightness may be the same or higher. Thus, no real loss of color brightness occurs.

Such a RGBW system more closely approaches the 'real world' natural image envelop and statistics, providing higher brightness and deeper saturation. The present invention discloses a plurality of high brightness layouts for displays. These layouts, in turn, may be driven by various Gamut Mapping Algorithms (GMA)—either in the prior art or as disclosed in many applications incorporated herein. Further, with the use of SubPixel Rendering (SPR) algorithms as disclosed in applications incorporated herein, such panels may maintain color accuracy while lowering cost and increasing contrast.

As disclosed on other applications incorporated by reference, one embodiment of a SPR algorithm treats the White subpixel as another color primary. Starting from color theory basics, this embodiment transforms the values of the input RGB using linear matrix multiplication. This results in a transform that maintains the hue and saturation of all colors.

The brightness increase from RGB to RGBW may be linear and a constant multiplier for all colors inside of the RGBW brightness/saturation gamut envelope. In the unlikely event a bright, saturated color in the image exceeds the RGBW brightness/saturation gamut envelope, one embodiment maps the color to the brightest color at that same hue and saturation that the display may render. This may be a reasonable trade-off, as the human vision system does not measure absolute brightness, only relative brightness. Further, very bright, highly saturated colors are an infrequent occurrence in natural images. Thus lowering the peak brightness of a highly saturated color slightly does not severely distort an image; while color saturation and hue are generally recognized and noticeable when they are distorted.

High Brightness Layouts for Displays

Having discussed some of the advantages and trade-offs of high brightness (e.g. RGBW) layouts, several embodiments of such layouts will now be disclosed. FIG. 1 depicts one embodiment of layout 100. Layout 100 substantially comprises a plurality of repeating subpixel group 102 further comprising white (e.g. no color filter) 104, green 106, red 108 and blue 110 subpixels. As may be seen, the white subpixels are the majority number of all the subpixels and may optionally comprise a smaller dimension and/or area than the other colored subpixels. The value of placing the white on the majority, thinner, subpixels is that they provide high Modulation Transfer Function (MTF) depth. The same effect is given to the higher occurrence of green subpixels as compared to red and blue subpixels.

For subpixel rendering this display, the white subpixels may be mapped one to one with an incoming conventional data set (e.g. RGB or any other suitable data format). The colors may then be subpixel rendered, filtered to remove chromatic aliasing to maintain proper color, in the manners described in several applications incorporated by reference. Also, the phase of the planes may be adjusted to be either coincident with the incoming data set or 180° out of phase with the white subpixel alignment as desired. The first may be suitable for text and other non band-limited images, the second may be suitable for pictures or supersampling subpixel rendering of text, glyphs, etc. The color subpixel locations may also benefit from interpolation/subpixel rendering for proper digital image reconstruction of bandlimited images.

It should be noted that the backlight color temperature may be adjusted to have more magenta, red and blue, energy than that for the typical RGB LCD to give a balanced white. Alternatively, the green subpixels may be adjusted towards the upper green point on the CIE 1931 chart, decreasing its brightness but increasing its color saturation, to give better color gamut and proper white balance. Another alternative might be to combine the effects of the above two embodiments. It should also be noted that this layout has an MTF Limit (MTFL) at the Nyquist limit of the white subpixels in all directions. MTFL may be thought of as the highest number of black & white lines that may be simultaneously rendered without chromatic aliasing.

It will be appreciated that the present invention encompasses all mirror images of the repeating subpixel groups and other symmetries possible for FIG. 1 and for all Figures disclosed herein. Additionally, the position assignments of the colored subpixel are also subject to change without departing from the scope of the present invention. For example, the positions of red and blue subpixels in FIG. 1 may be changed or transposed within the scope of the present invention. Also, the positions of the green subpixels may be changed with the red and the blue subpixels within the scope of the present invention.

Another set of embodiments for the present invention included: for every subpixel layout shown herein having a "white" subpixel, an additional embodiment would replace some or all of the "white" subpixels with the colors "yellow", "grey", or "blue-grey" (e.g. not colored but fully transmissive). Yellow, grey, or blue-grey do not have the same transmissivity as white does; however, yellow, grey or blue-grey do present high transmissivity and would also provide a "high" brightness performance. For subpixels layouts employing red, green, blue, white, and cyan, it might be desirable to replace some or all of the white with the color "pink".

Figure 2:
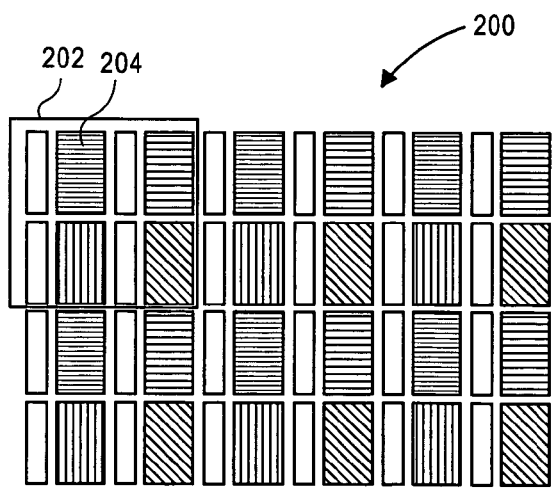
Figure 3:
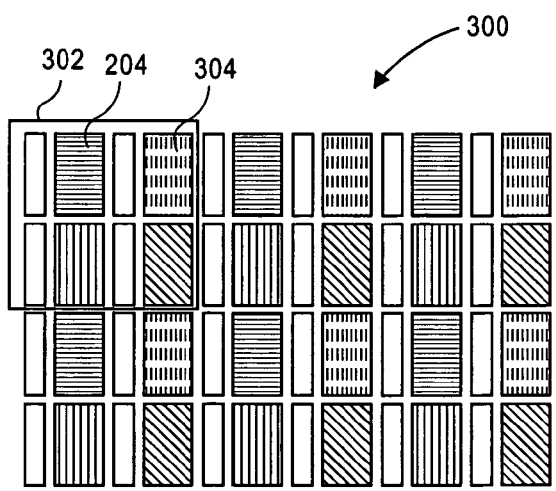

Two other embodiments of high brightness layouts are shown in FIGS. 2 and 3. As with FIG. 1, the white subpixels are the majority subpixels and may optionally be of decreased size or dimension. This gives high MTF Limit performance. The repeating pattern 202 in FIG. 2 comprises red, green, and blue subpixels—as well as a cyan subpixel 204 (shown in finer horizontal hatching lines than the blue subpixels in these Figures). This may perhaps have more blue resolution than may be required, but the arrangement should be straightforward to manufacture and subpixel render. For white color balance, the backlight may be more red energy, to counter the increased transmission of cyan, than the typical backlight for an RGB LCD display. Alternatively, the green and cyan may be darker, purer colors, towards the green peak of the CIE 1931 chart, resulting in a high color temperature display. This arrangement may allow for a bright, high MTF Limit, high SPR Moiré Limit, high color gamut display. Given that the white subpixel adds brightness to the system and that the use of the cyan color tends to give a wider color gamut, it may be advantageous to set the color points of the minority subpixels to be deeply saturated to result in a wide color gamut.

FIG. 3 depicts an alternative for a five color system, RGMCW system, allowing even higher MTF Limit performance at the expense of deep blue performance. The repeating subpixel group 302 comprises red, green, cyan (204) and magenta (304) subpixels. In another embodiment, it may be possible to vertically displace the white majority subpixels from the minority subpixel grid 180° to expand the SPR Moiré Limit to a full circle. As these layouts have a square grid of white subpixels, the monochromatic MTF Limit displayed is a square MTF Limit boundary, matching that of the conventional RGB Stripe system.

Figure 4:
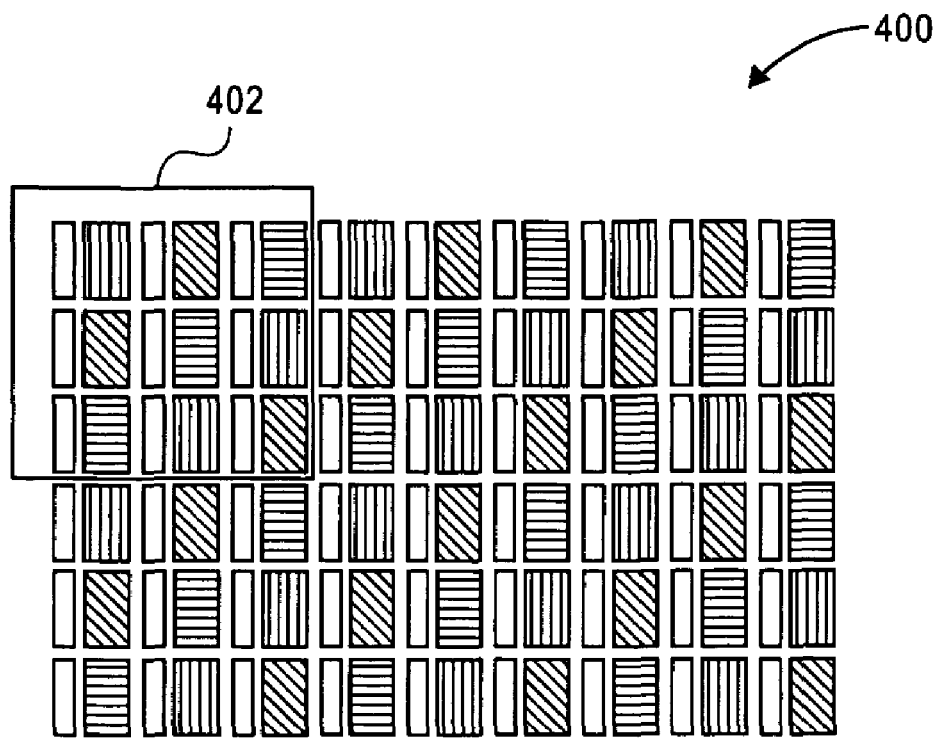

FIG. 4 is yet another embodiment of a high brightness layout 400. Its repeating subpixel group is a 3×6 subpixel group 402 where the colored subpixels comprise red, green and blue subpixels in a mosaic pattern. Here the white subpixels are again the majority subpixels and are optionally more narrow that the other colored subpixels. The RGB colored subpixels are equal in number and size. This display may have the virtue of using a conventional backlight color and having pure white at maximum brightness when all of the subpixel values are full "on". This panel may also be immune to color shifts when mask shifts occur during manufacturing.

This panel tends to have high Luminance MTF Limit out into the corners as well as an extended Moiré Limit. However, it may have a highly asymmetrical chrominance MTF Limit, as with the classic Mosaic pattern. As one third of the panel area is high brightness white, the brightness is expected to be significantly higher than a traditional RGB panel using the same color filter points. This added brightness of the white may be used to trade-off some of the brightness gain for color gamut increase for a TV or HDTV product, by using higher saturation, but lower transmission color filters, as previously described.

As an alternative, the subpixel width ratio could be altered as desired for white/color brightness trade-off. For example, one could set the two sizes identically, giving a brighter white value, but lower saturated color brightness. This example has the added benefit of using the same size subpixels, with an aspect ratio of one-to-two (1:2)— or, alternatively, one-to-three (1:3)—being very easy to design and manufacture with present design rules. Yet another alternative might be to place the red, green and blue subpixels in vertical or horizontal stripes.

Figure 5A:
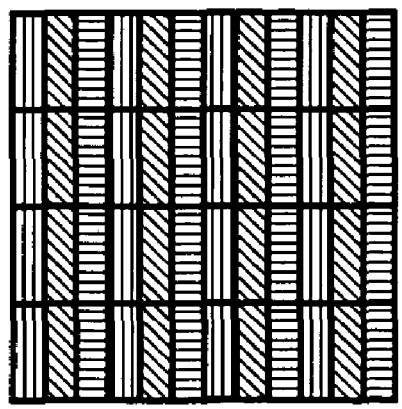
FIGS. 5A and 5B are side-by-side comparisons of conventional RGB stripe layout next to one embodiment of the present invention, respectively.
Figure 5B:
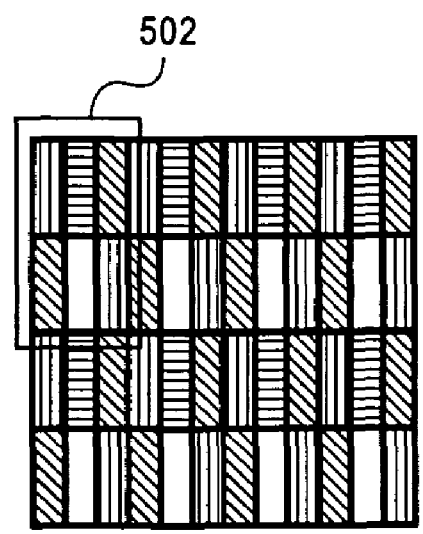

In the co-pending '094 application, the layout of FIG. 5B has been proposed where the pixel size has an aspect ratio of 2:3 (width:height). This may result in increased pixel visibility when compared to RGB stripe at same resolution. Thus, FIG. 5B shows a similar layout repeating group 502 with red, green, blue and white subpixels; but with a one-to-three (1:3) aspect ratio of conventional RGB stripe, shown for comparison in FIG. 5A. One advantage is that the layout may utilize the existing RGB-stripe TFT array.

It should be noted that the pixel sizes are identical but the color order is changed. The repeat cycle is 2×3 pixels. The white pixels are shown in line within a row, but they can also be made to alternate for another embodiment. Resolution for this design should be 2× in horizontal axis compared to RGB stripe and 1× in vertical. Subpixel rendering can be adjusted to perform scaling in horizontal, or a video chip can be used to sample the data at 2× rate in horizontal axis. In either case, the performance of the LCD should be improved with less Moiré noise and higher MTF. Brightness gain for 25% color filter transmission should be $((5/6)*25+(1/6)*100)/25=37.5/25=1.5$.

Figure 6A:
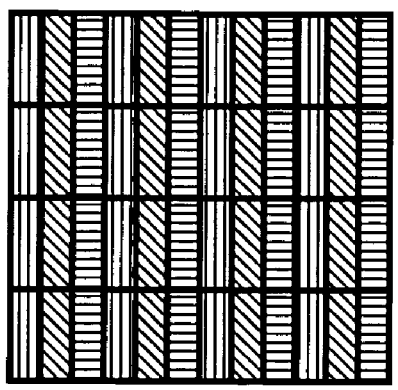
FIGS. 6A and 6B are side-by-side comparisons of conventional RGB stripe layout next to another embodiment of the present invention, respectively.
Figure 6B:
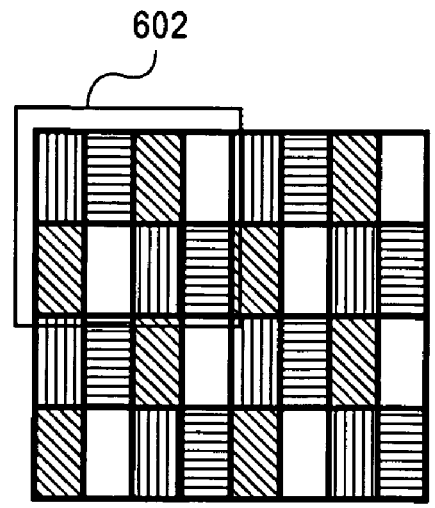

FIG. 6B is yet another embodiment (shown next to RGB striped panel FIG. 6A) that has a repeating group 602. In this embodiment, the subpixels are of substantially equal size to maintain white balance. The repeat group 602 is 2×4 subpixels. It should be noted that the number of colors is the same within a repeat group (R, G, B, W). This should result in balanced white with existing backlights. In this case the horizontal and vertical resolution should be the same as RGB stripe, but the number of column drivers and TFTs is reduced by 1/3. Brightness gain depends on color filter transmission; assuming 25% transmission (typical) for colored filters and 100% for white, then transmission for white screen is $(3/4)*25+(1/4)*100=175/4=43.75\%$ which is roughly a gain of 43.75/25=1.75.

Figure 7A:
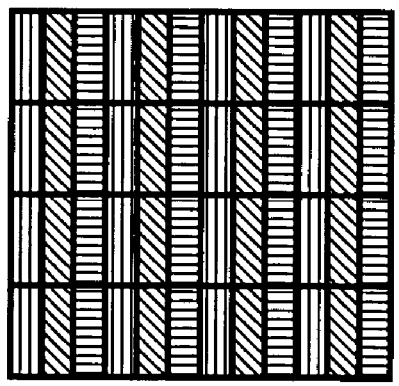
FIGS. 7A and 7B are side-by-side comparisons of conventional RGB stripe layout next to yet another embodiment of the present invention, respectively.
Figure 7B:
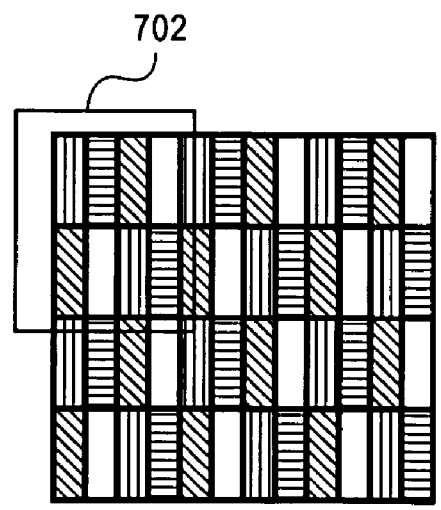

FIG. 7B (shown next to RGB stripe layout FIG. 7A for comparison) is a variation of FIG. 6B. In this case, the subpixel repeating group 702 is the same as group 602 but in the 1:3 aspect ratio. In this case, the resolution in the horizontal tends to be increased by 1.5×. This design uses existing TFT array and drive electronics with no cost savings, but resolution and brightness tends to be increased. Brightness gain is similar as noted above Now, brightness with the novel high brightness layouts disclosed herein may have an impact in the portable (e.g. cell phone) application and the TV market as a consequence. As with typical RGB-stripe LCDs utilize, the transmissivity of the LCD is typically 5-10%, depending on color filter and polarizer transmission, as well as "aperture ratio" of TFT array. Thus to achieve 500 cd/m2 output, as much as 5000-10000 cd/m2 output from the backlight may be required. This can increase cost and increase heat of the TV system. In portable applications, it can reduce battery life.

With the novel high brightness layouts disclosed herein, the backlight brightness may be reduced by as much as one half as required by conventional RGB striped systems having substantially the same resolution. This decrease in backlight brightness is made possible by (a) increasing the aperture ratio by using these novel layouts, and (b) increasing transmission of the system by adding white subpixels. In these embodiments, the brightness of the system may improve by up to 1.75× or, alternatively, the power can be reduced by more than 40%. In the case of LCD TV for home use, this can mean a reduction in the number of lamps from 16 to 10, for significant power, cost, and heat savings, while maintaining average brightness.

For all of these high brightness layouts, it is possible to discuss a "Figure of Merit" (FOM) to help compare the performance of these layouts. A simplified FOM might be the number of pixels expressed by the MTFL in each axis divided by the subpixels, expressed as a percentage.

For example, the conventional RGBW "Quad" pattern which has as a repeating group:

| G | B |
|---|---|
| R | W | in a square pattern.

For large billboards, the Quad pattern is implemented by four incandescent lamps arranged in a square pattern repeat unit. The colored primaries are formed by pigment paints on the lamps. The brightness loss is significant, thus the unfiltered white lamp provides much needed brightness. The Quad pattern is typically treated as a square pixel. Although subpixel rendering may be applied (and thus improve), the Quad pattern is not as optimal as the novel layouts disclosed herein—as the Quad requires two lines of subpixels in any axis to draw a single white line. Since it takes four subpixels to equal one 'pixel', the FOM value is 25%.

Figure 8:
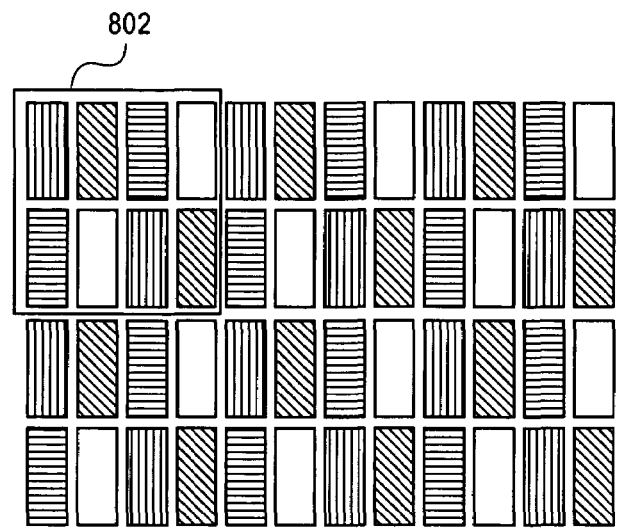
FIGS. 8 through 11A-C are several other embodiments of high brightness layouts as made in accordance with the principles of the present invention.

FIG. 8 is yet another embodiment substantially comprising repeating group 802 with its subpixels in a 1:2 aspect ratio. This layout may have less edge boundaries that give rise to liquid crystal disinclinations, and thus has higher contrast than an LCD based on the RGBW Quad and even the RGB Stripe. This layout, like the Quad above, has 25% white area, thus it can have approximately 75% to 100% higher brightness than an RGB Stripe panel with the same resolution. It should be noted that each color is on a square grid at 45°. This layout requires only one row of subpixels to draw a single white line, while it still requires two subpixel columns. Thus, the Figure of Merit value is thus 50%.

Figure 9:
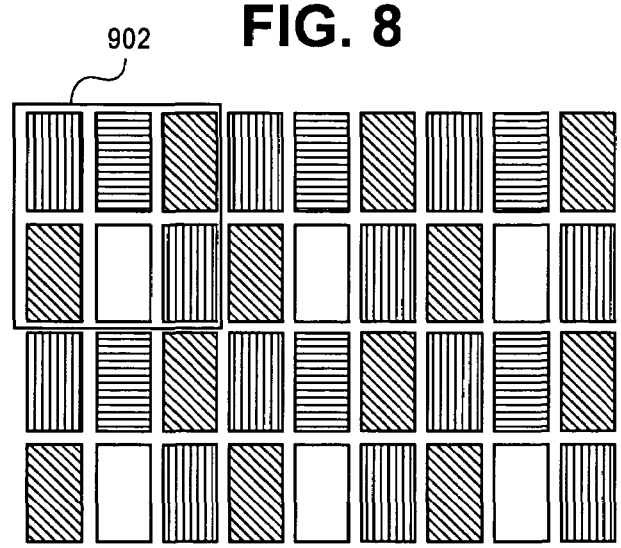

FIG. 9 is yet another embodiment substantially comprising repeating group 902. It may be advantageous for very high resolution (300+ dpi) mobile phones. As blue resolution is reduced in this layout, it may be desirable to use a high color temperature backlight to ensure that enough blue light is available to keep the panel at a desired white color when all of the subpixels are turned on to full value. As the white area is only 17%, the brightness increase is approximately 50%. The aspect ratio of the subpixels may be two-to-three (2:3) (or alternatively 1:3). For the layout of FIG. 9, it may be seen that the FOM for this layout is 66%.

Figure 10:
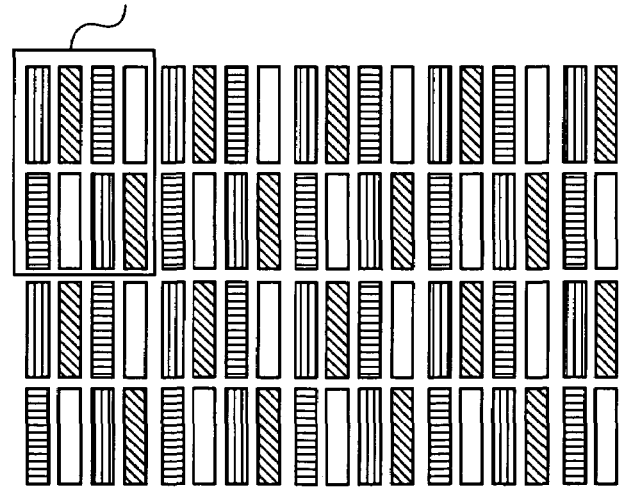

FIG. 10 is yet another embodiment having subpixel repeating group 1002. As the subpixels remain at one-to-three (1:3) aspect ratio, it may be easy to utilize existing backplanes for this layout. This layout would then have a higher MTFL in the horizontal axis than the conventional RGB it replaces. It would also be approximately 75% brighter. The additional horizontal resolution may further reduce moiré distortion. If the input signal has higher resolution, such as scaling down a 1080i signal to a 720p HDTV LCD, or 720p on a 480i TV, this panel may show up to 50% higher horizontal resolution than the RGB Stripe panel, thus showing the full horizontal resolution of the higher resolution format.

Figure 11A:
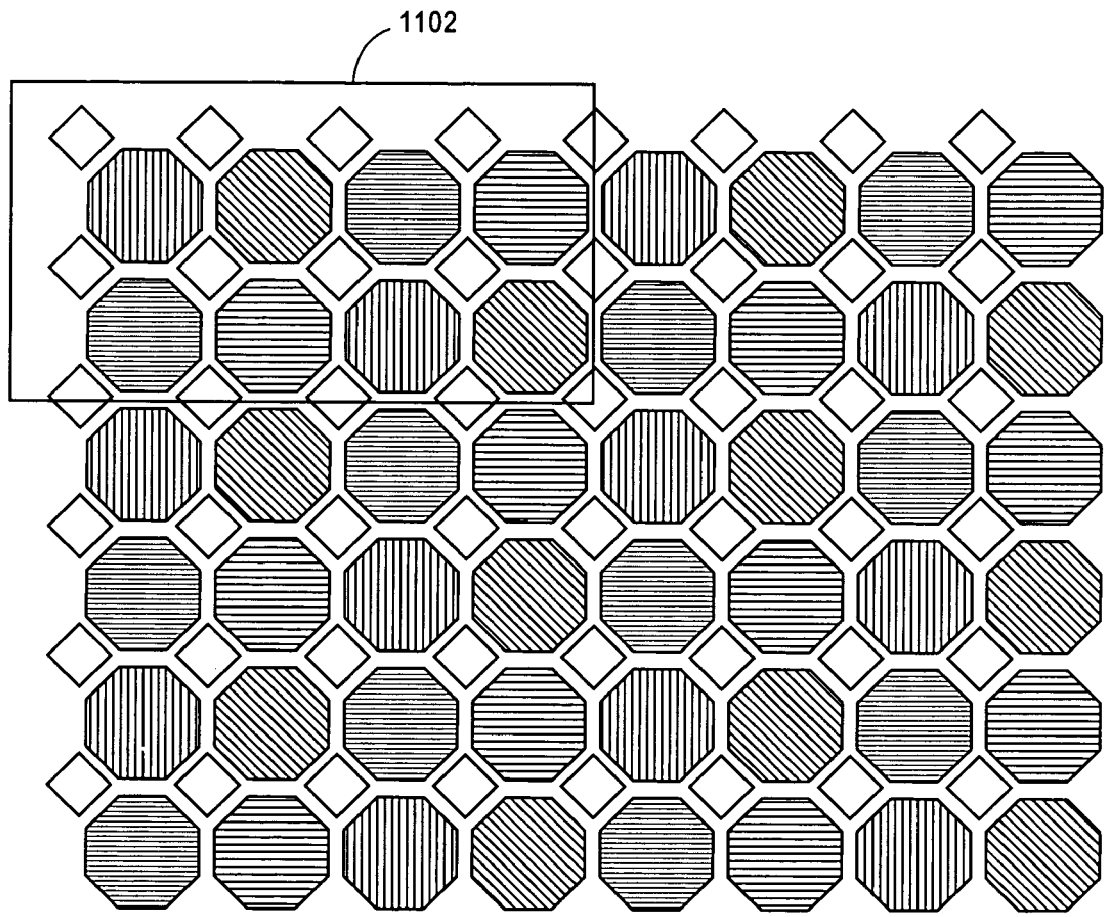

FIG. 11A is yet another embodiment of a high brightness layout having a 4×8 subpixel repeating group 1102. As may be seen, the subpixels are of a different shape than the traditional rectangular. The white subpixels (shown without hatching) are the majority subpixels and are optionally of a smaller size or dimension as the colored subpixels which comprise red, green, blue and cyan in this embodiment. As may be seen, the white subpixels could be interstitial (e.g. displaced 180 degrees) to the colored subpixels. As may be seen, the subpixel repeating group 1102 is larger than the other ones shown in the other figures because the color subpixels are placed on a hex grid. One possible advantage of a hex grid is that it tends to scatter the Fourier energies in more directions and points. This may be especially useful for the dark luminance wells caused by the blue subpixels. Another possible advantage is that each row contains all four colors as well as the white subpixels, allowing for horizontal lines to be black and white, fully sharpened, without chromatic aliasing. It will be appreciated that all of the subpixel repeating groups in all of the Figures shown herein may also be placed on a hex grid in a similar fashion and is contemplated within the scope of the present invention.

Figure 11B:
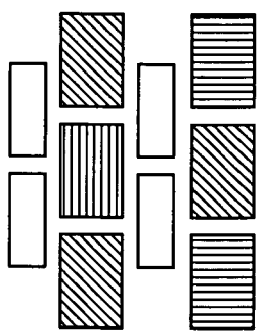
Figure 11C:
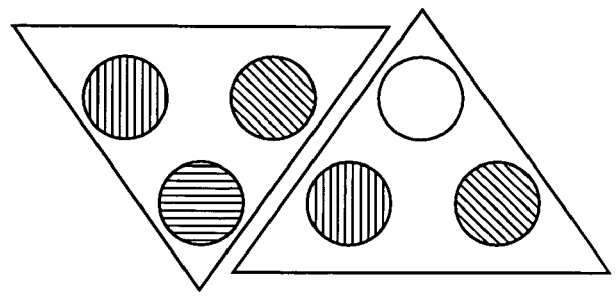

FIG. 11B is yet another embodiment of a high brightness layout where the white majority subpixels are vertically displaced from the minority subpixels. This tends to expand the SPR Moire Limit to a full circle. If the layouts have a square grid of white subpixels, the monochromatic MTF Limit displayed is a square MTF Limit boundary, matching that of the conventional RGB stripe system. It will be appreciated that all of the layouts disclosed herein may be made to have the white subpixels so vertically displaced and the scope of the present invention encompasses these alternatives. FIG. 11C is yet another embodiment of a high brightness layout in which a white subpixel replaces a blue subpixel in a delta triad pattern. Although the subpixels are shown as dots in FIG. 11C, they may, of course, be implemented as rectangular subpixels— or in many other shapes—as desired.

Figure 12:
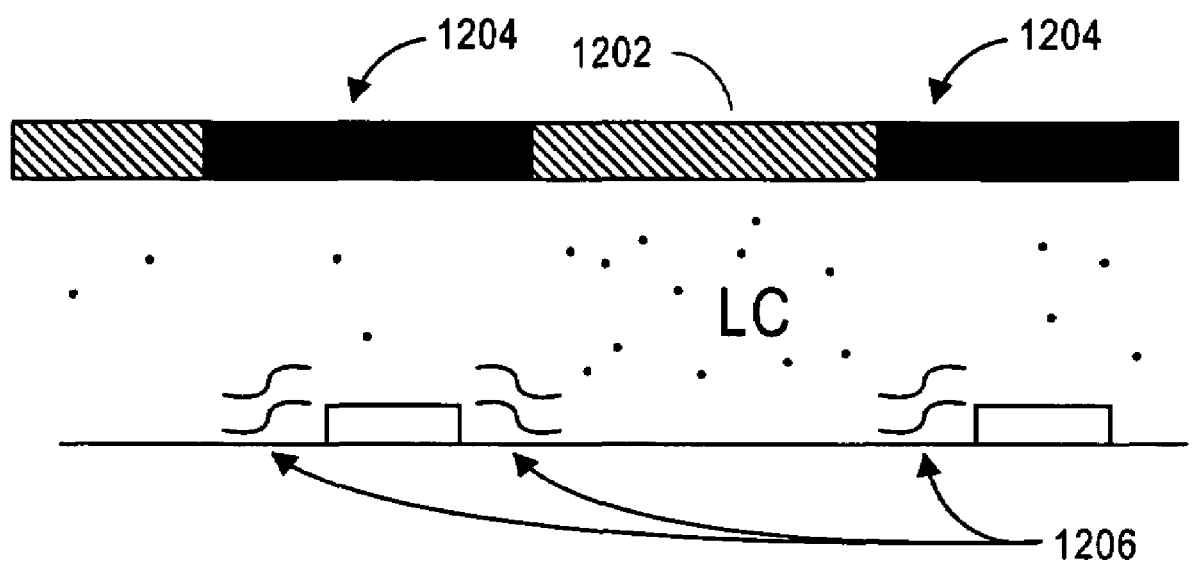
FIG. 12 is one embodiment of locating disclination regions with respect to black matrix for high brightness and other layouts.

As was mentioned above, LCD contrast is set by many parameters, including light leakage from disclinations or other LC distortions around the edges of subpixels. To cancel the light coming from these regions, the black matrix may be enlarged to cover this region. This may reduce light transmission, but also may improves contrast. FIG. 12 shows one possible embodiment. Black matrix is enlarged, adjacent to colored filter 1202, and tends to hide the disinclination regions 1206 below.

In many of the embodiments disclosed herein (as well as in many applications incorporated herein), the layout uses subpixels that are wider than normal RGB stripe, which tends to result in 10-100% increase in aperture ratio, depending on pixel density. The black matrix may be held constant and the light transmission increases. However, it may also be desirable to "give up" some of the light transmission gain and increase the black matrix width to cover more of the disclination region at the edge of the pixel. This may improve the overall contrast by reducing the dark state brightness of the LCD. The bright state brightness may be higher owing to the increased transmission; thus the contrast ratio will be improved. Further, the black matrix may be differentially adjusted for different colored regions, subpixels, such that the brighter subpixels, such as white, green, or even cyan, have more area at the periphery covered by the black matrix to reduce leakage from the disclinations, thus increasing the contrast while maintaining to some degree, the saturated brightness of the darker colors such as red and blue. Each of the colored subpixels may be thus adjusted independently, as desired. For example, the white may have the most area covered by the black matrix to have the greatest impact on the contrast of images.

While disclinations have been described as the source of light leakage around the edges of pixels, the present invention is not restricted to this phenomenon alone. In other designs, light leakage may be caused by field effects caused by the edge of electrodes, such as chevron patterns in MVA or IPS designs. The enlarged black matrix will help hide these sources of light leakage as well. It should be appreciated that this concept applies equally well to layout that are 3-color (i.e.

using only red, green and blue as subpixels) or other multiprimary layout (i.e. not using white as a subpixel)—as well as any RGBW design.

Although the layouts as described herein are suitable to LCD displays, these layouts find equal application in the area of incandescent lamp based displays, Light Emitting Diode (both organic and inorganic) based displays, Plasma display panels (PDP) and many other various display technologies.

Figure 13:
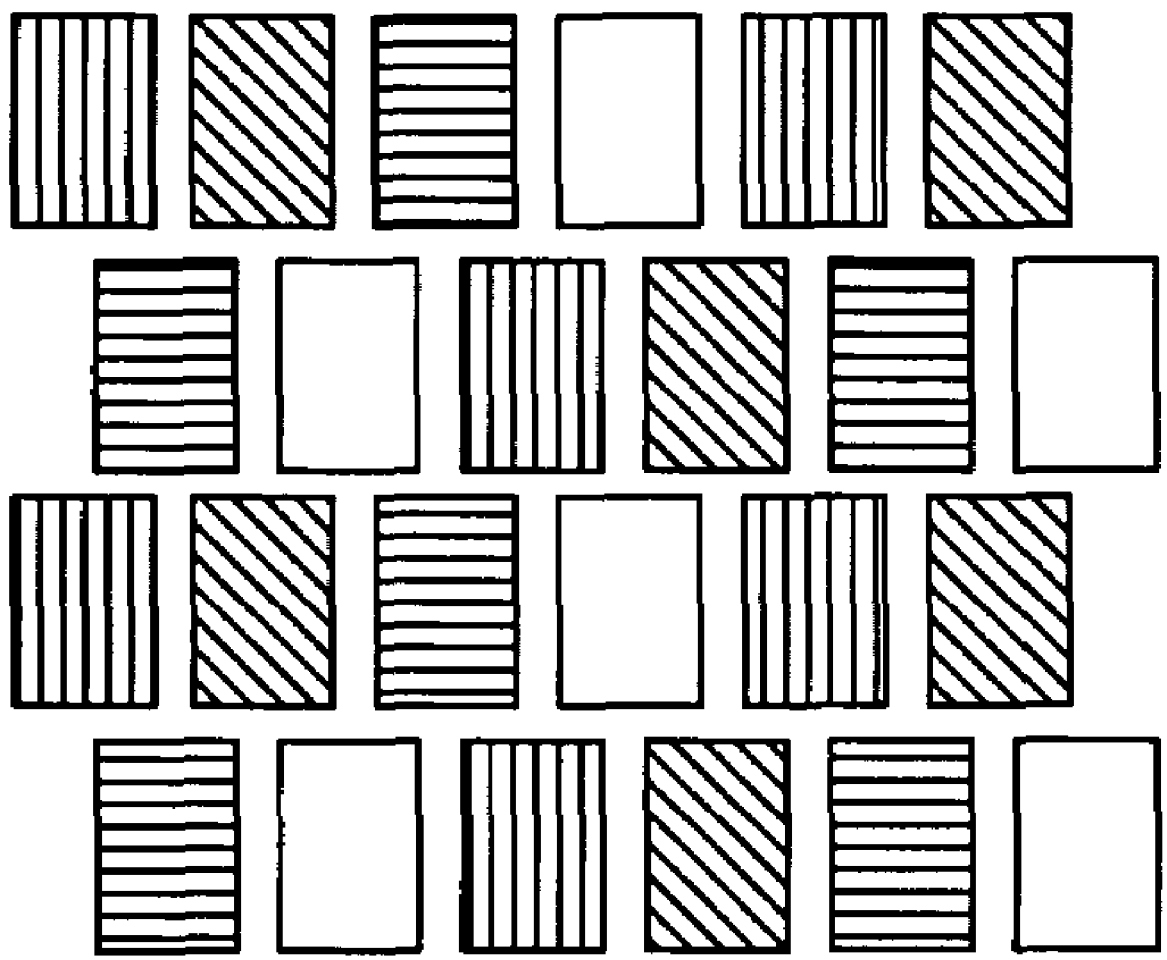
FIG. 13 is an embodiment of a high brightness delta triad subpixel layout.

FIG. 13 is one embodiment of a delta triad subpixel layout substantially corresponding to the color assignments in FIG. 11C. Of course, the present invention subsumes mirror images and other symmetries of this particular embodiment.

Figure 14:
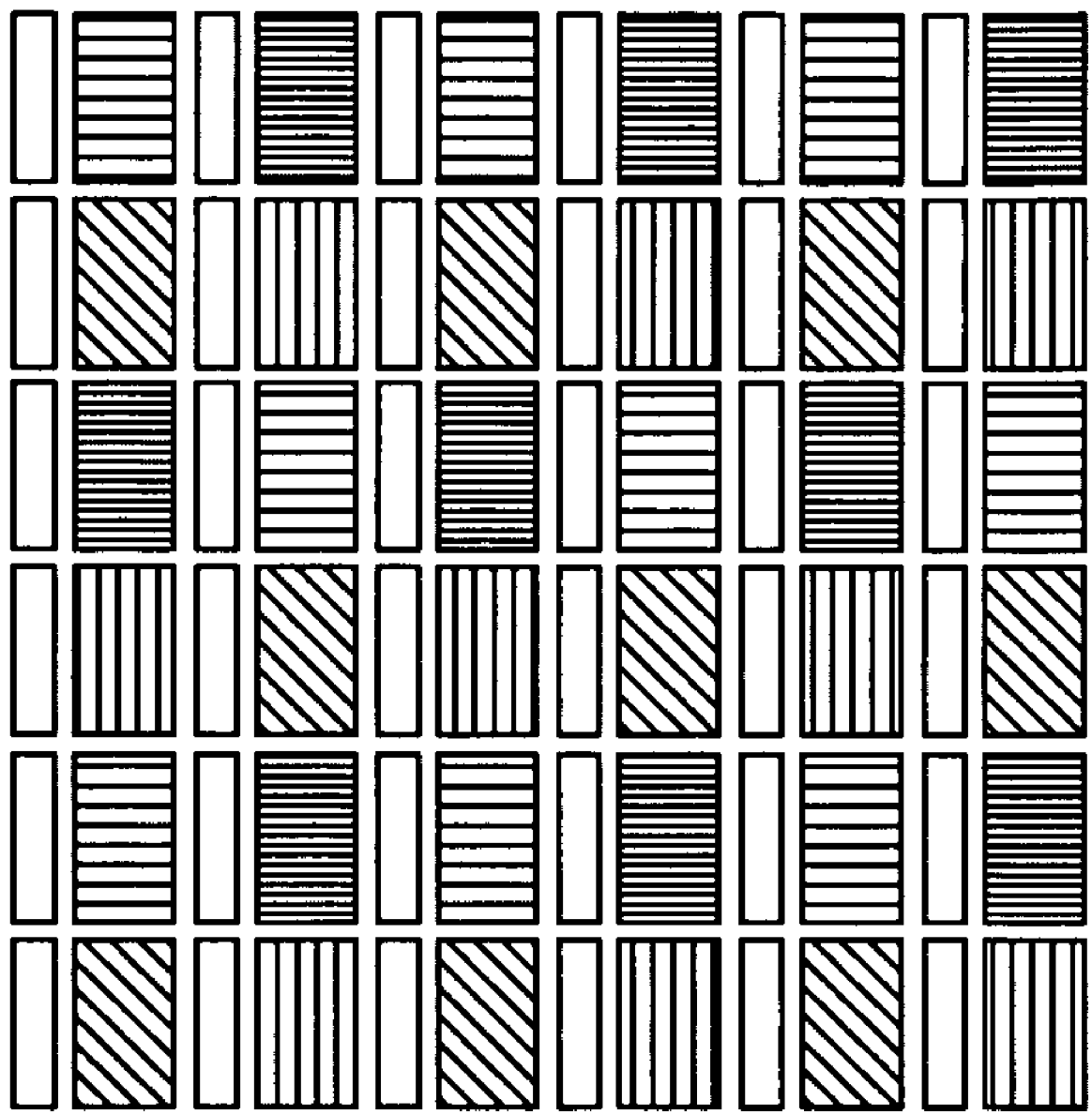
FIGS. 14 and 15 are additional embodiments similar to FIGS. 2 and 3 wherein the colored subpixels are on a hex grid.
Figure 15:
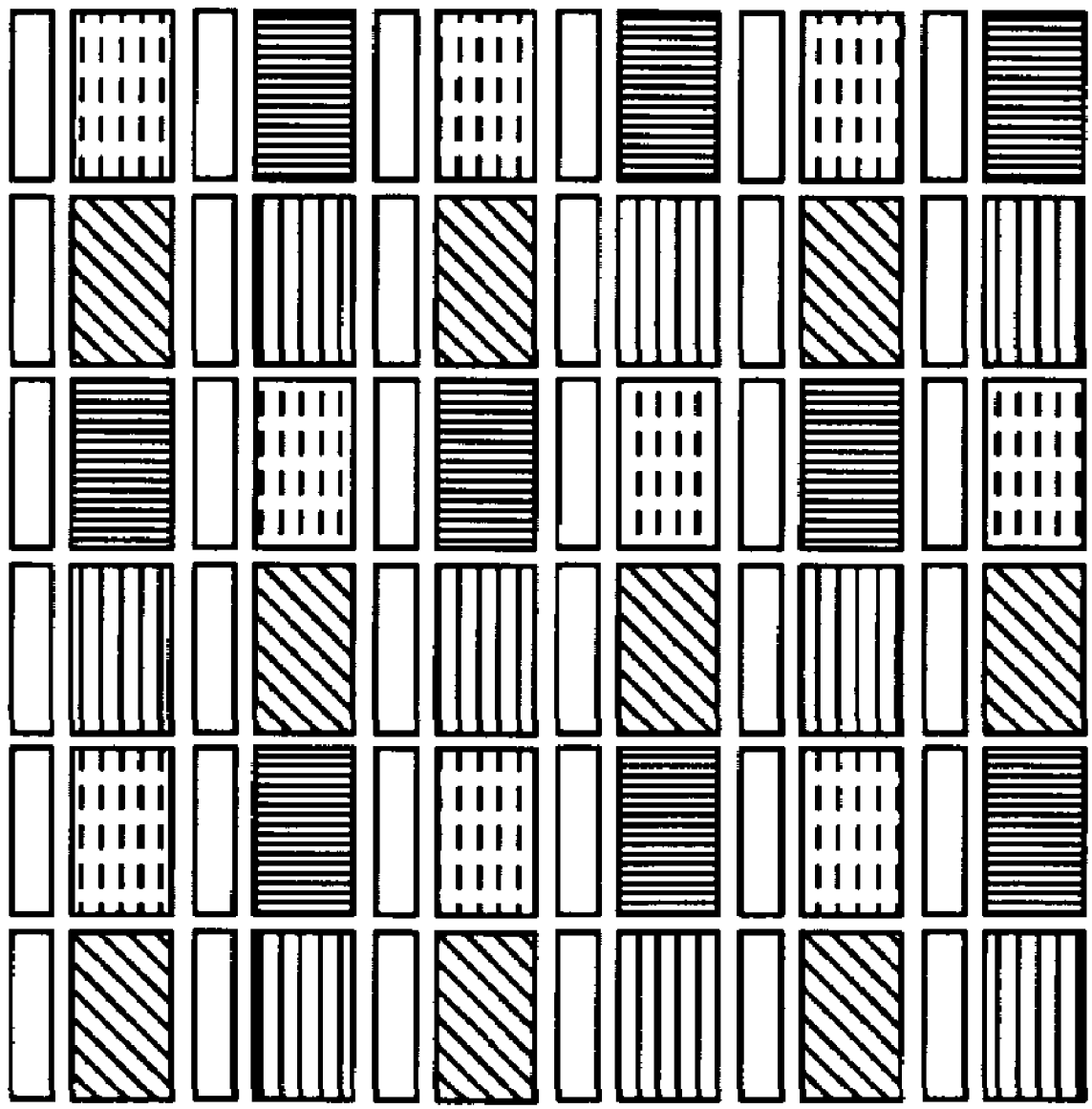

FIGS. 14 and 15 are additional embodiments that are similar to FIGS. 2 and 3 wherein further the individual colored subpixels are placed on hex grid, as opposed to a square grid.

Figure 16:
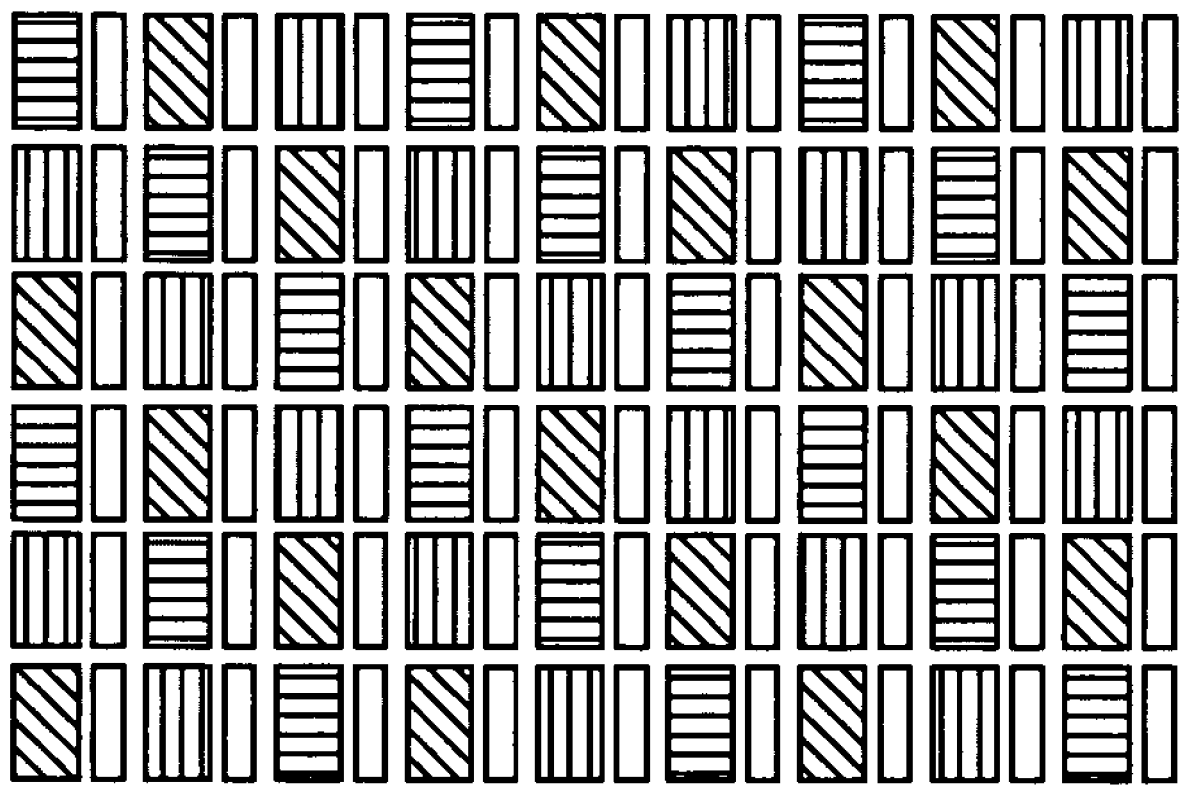
FIG. 16 is an additional embodiment similar to FIG. 4 wherein the colored subpixels form along a different diagonal line.

FIG. 16 is an additional embodiment that is similar to FIG. 4 but further wherein the colored subpixels form a different diagonal striping pattern as seen in FIG. 4.

Figure 17:
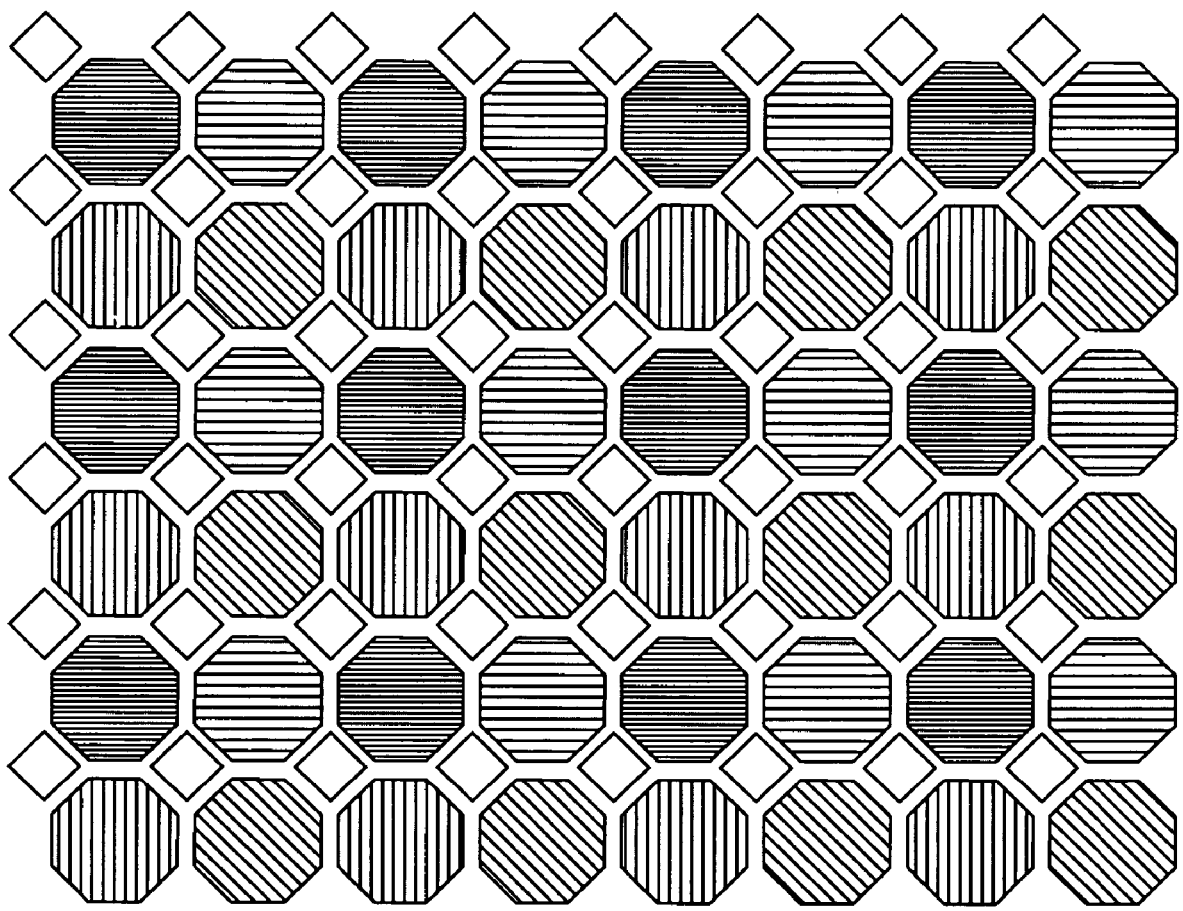
FIG. 17 is an additional embodiment that is similar to FIG. 11A but wherein the colored planes are placed on a square grid.
Figure 18:
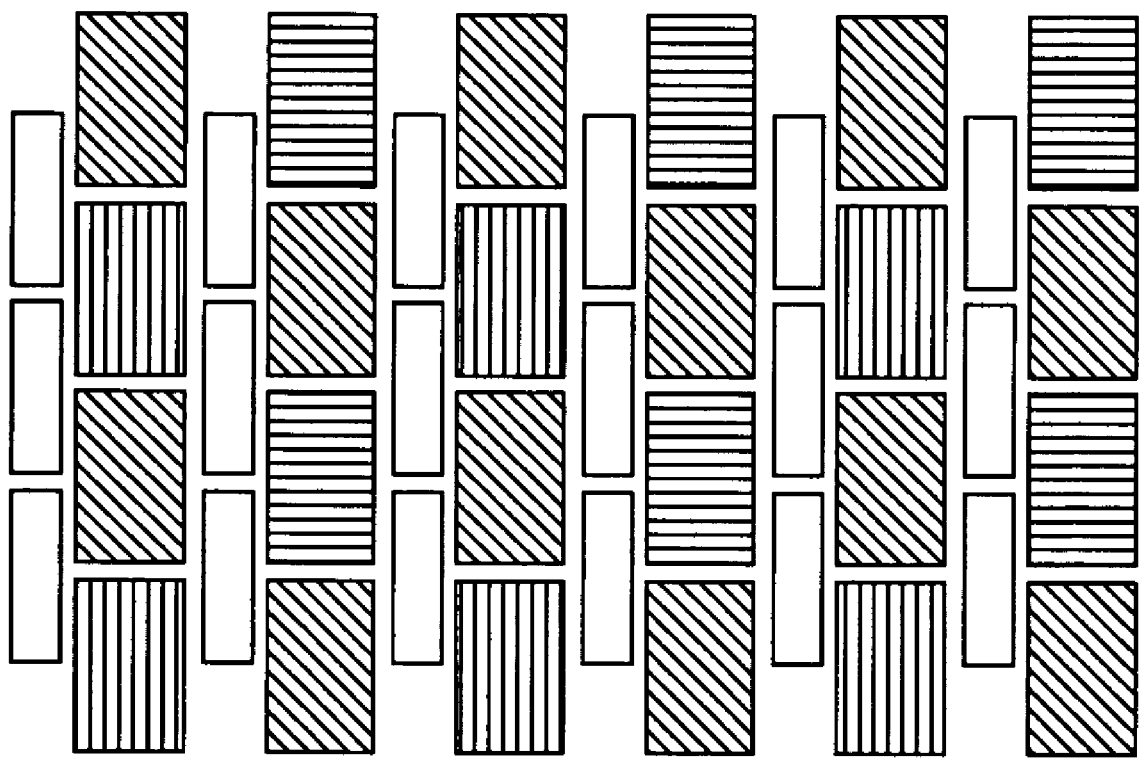
FIG. 18 to 24 are additional embodiments wherein the white subpixels are displaced.
Figure 19:
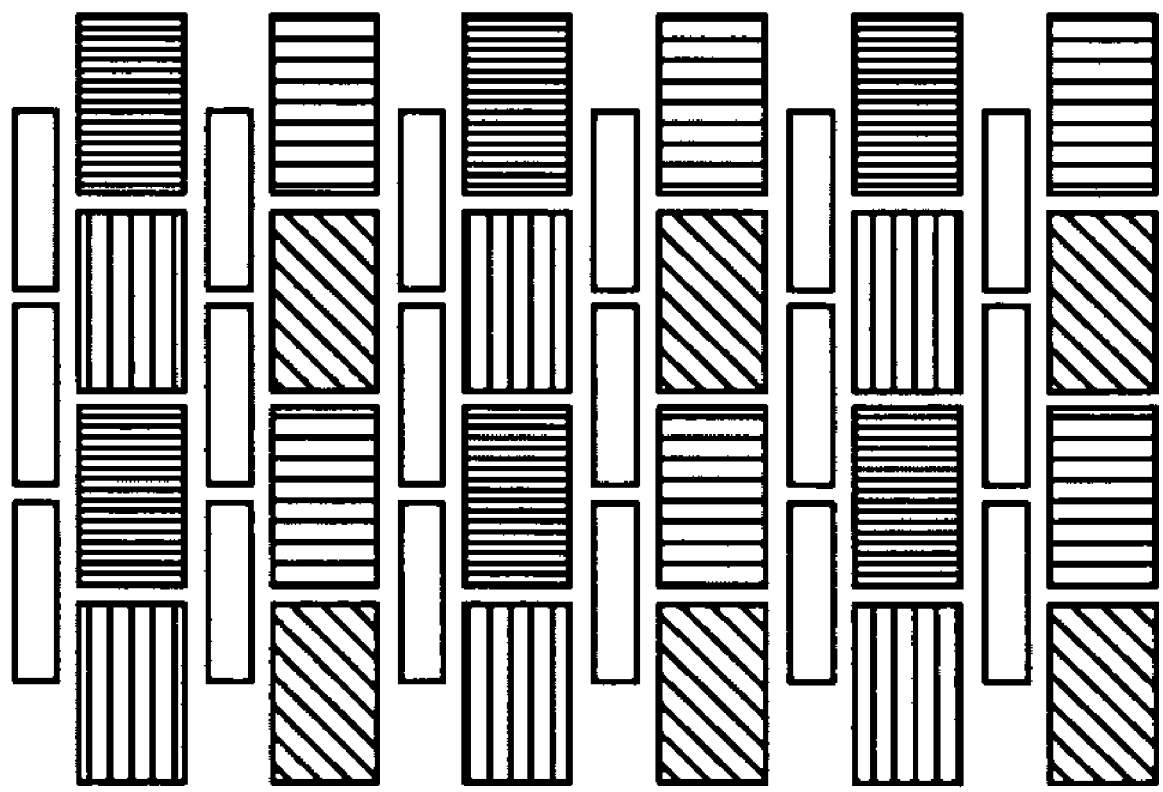
Figure 20:
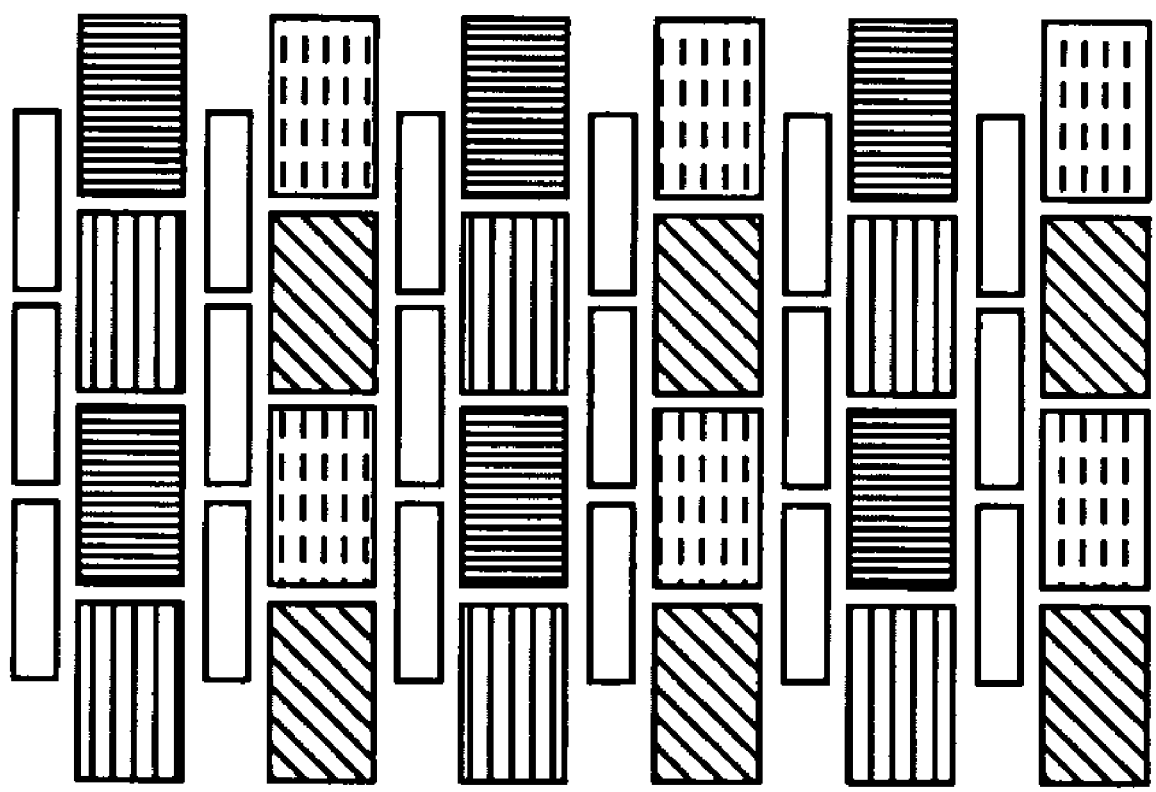
Figure 21:
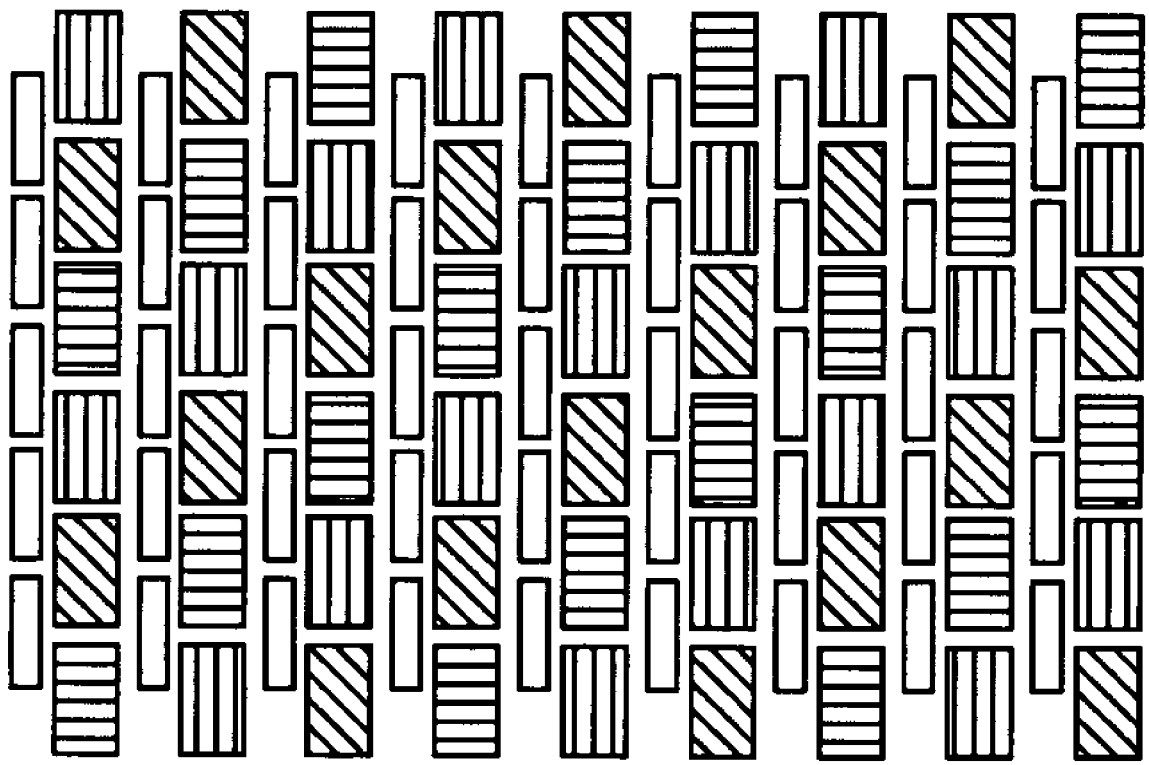
Figure 22:
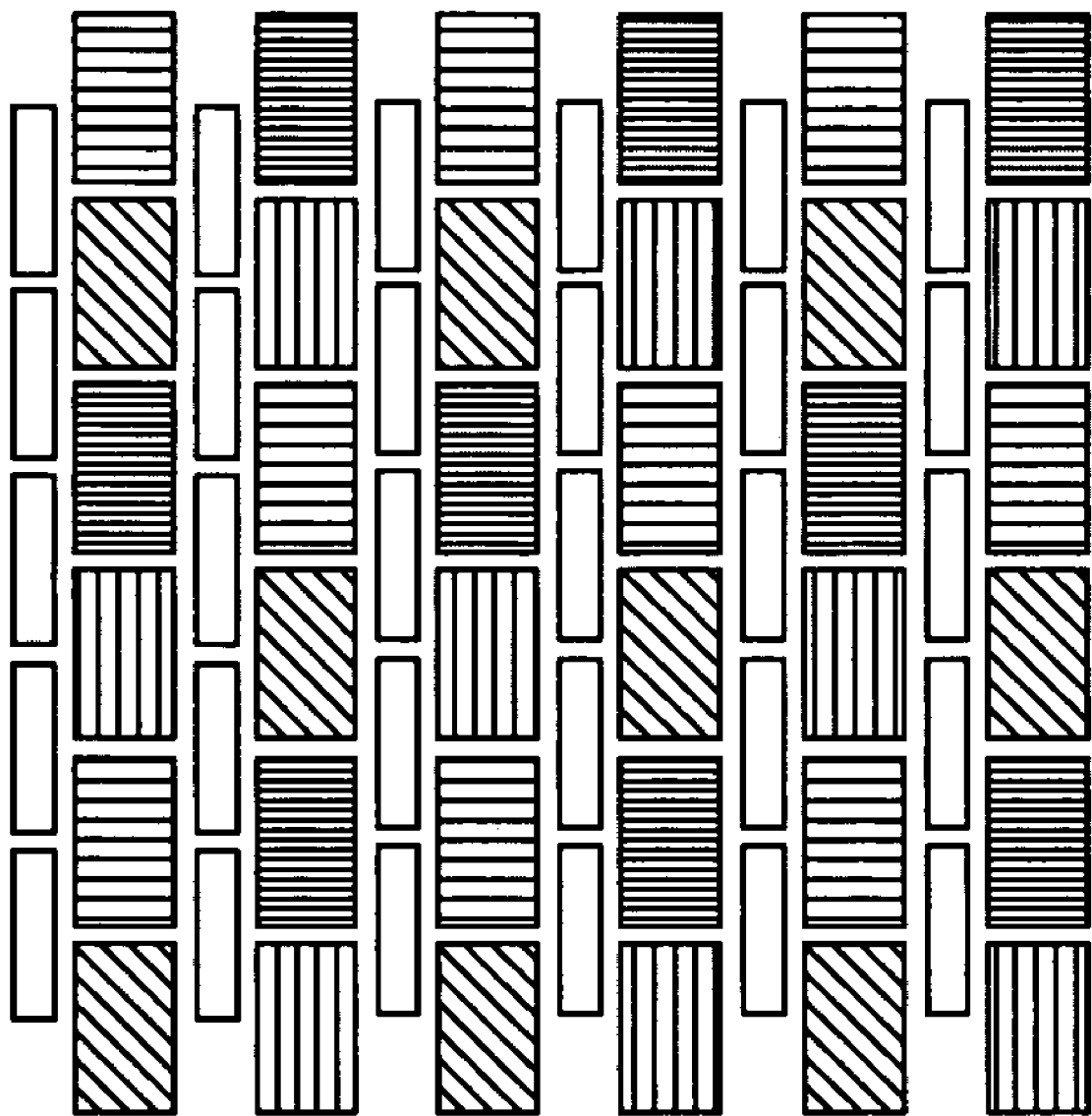
Figure 23:
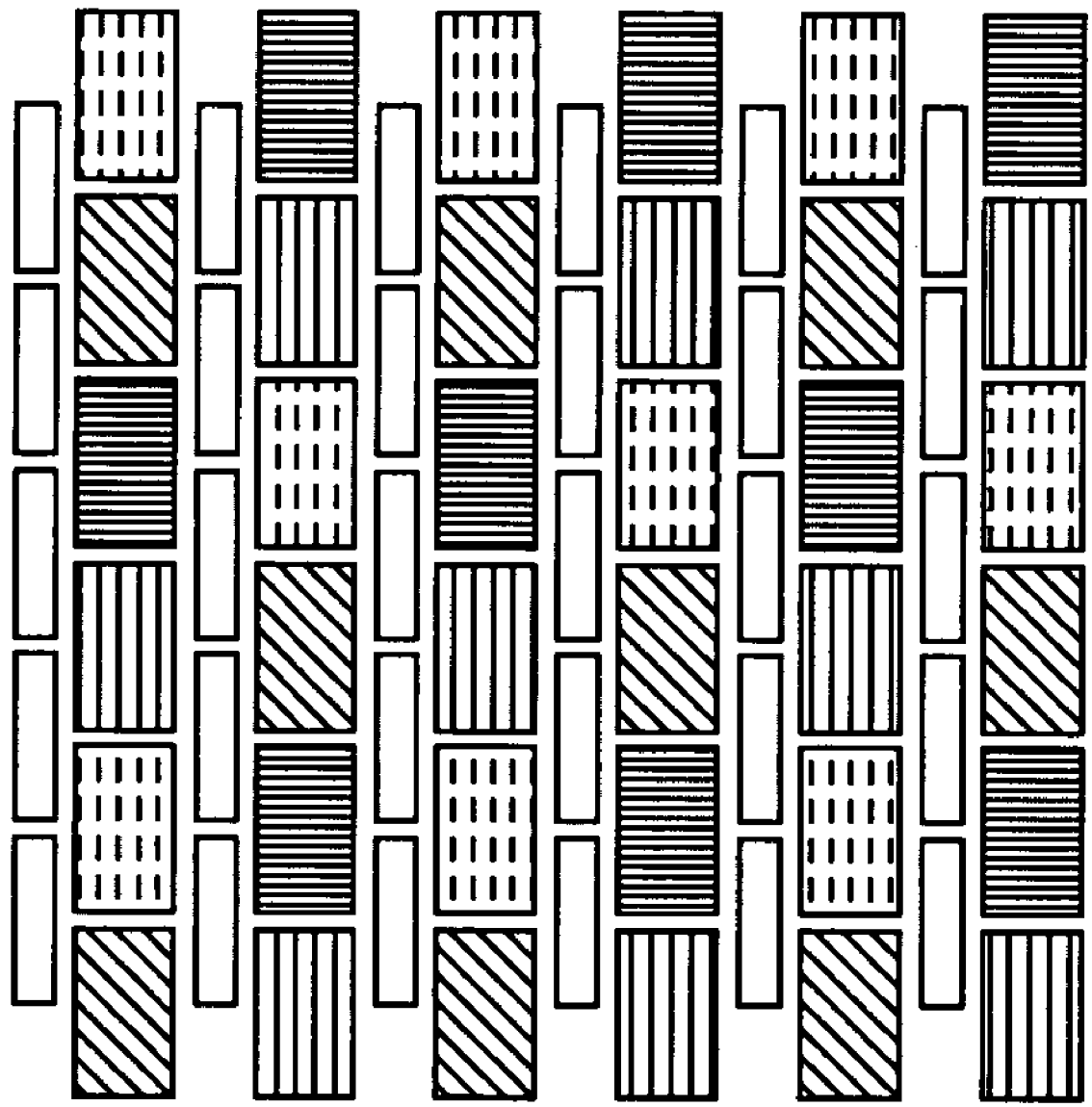
Figure 24:
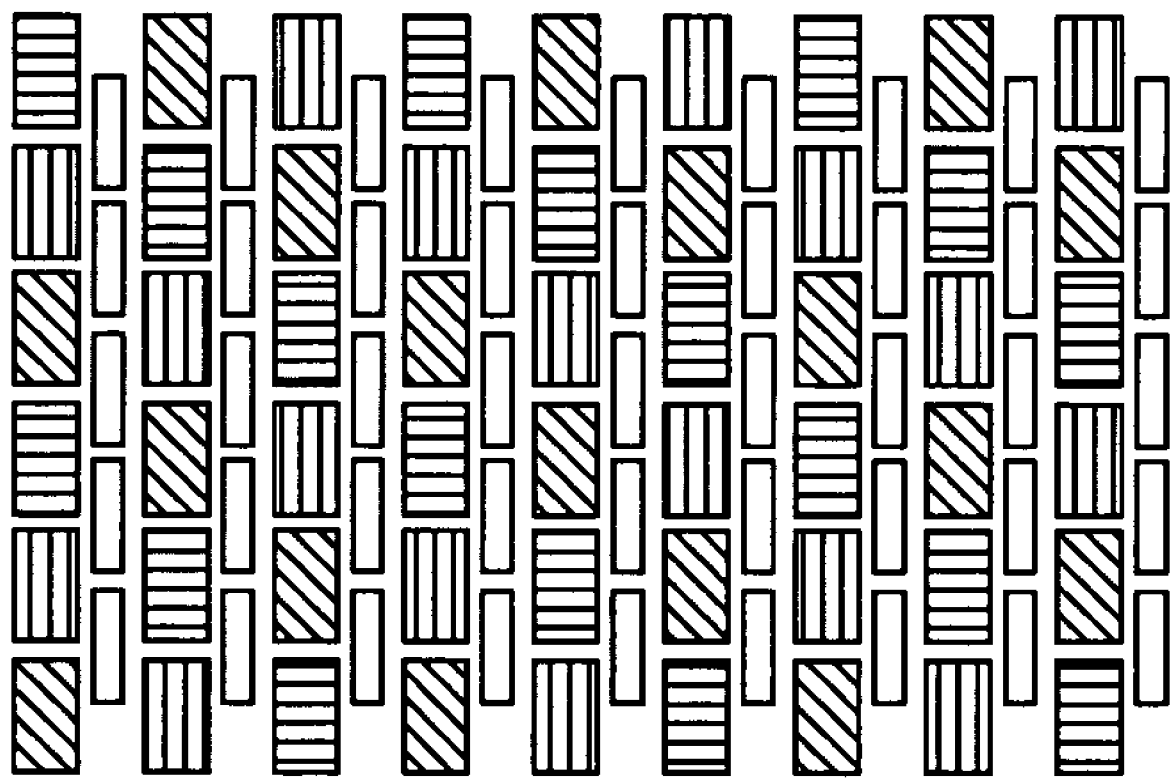
Figure 25:
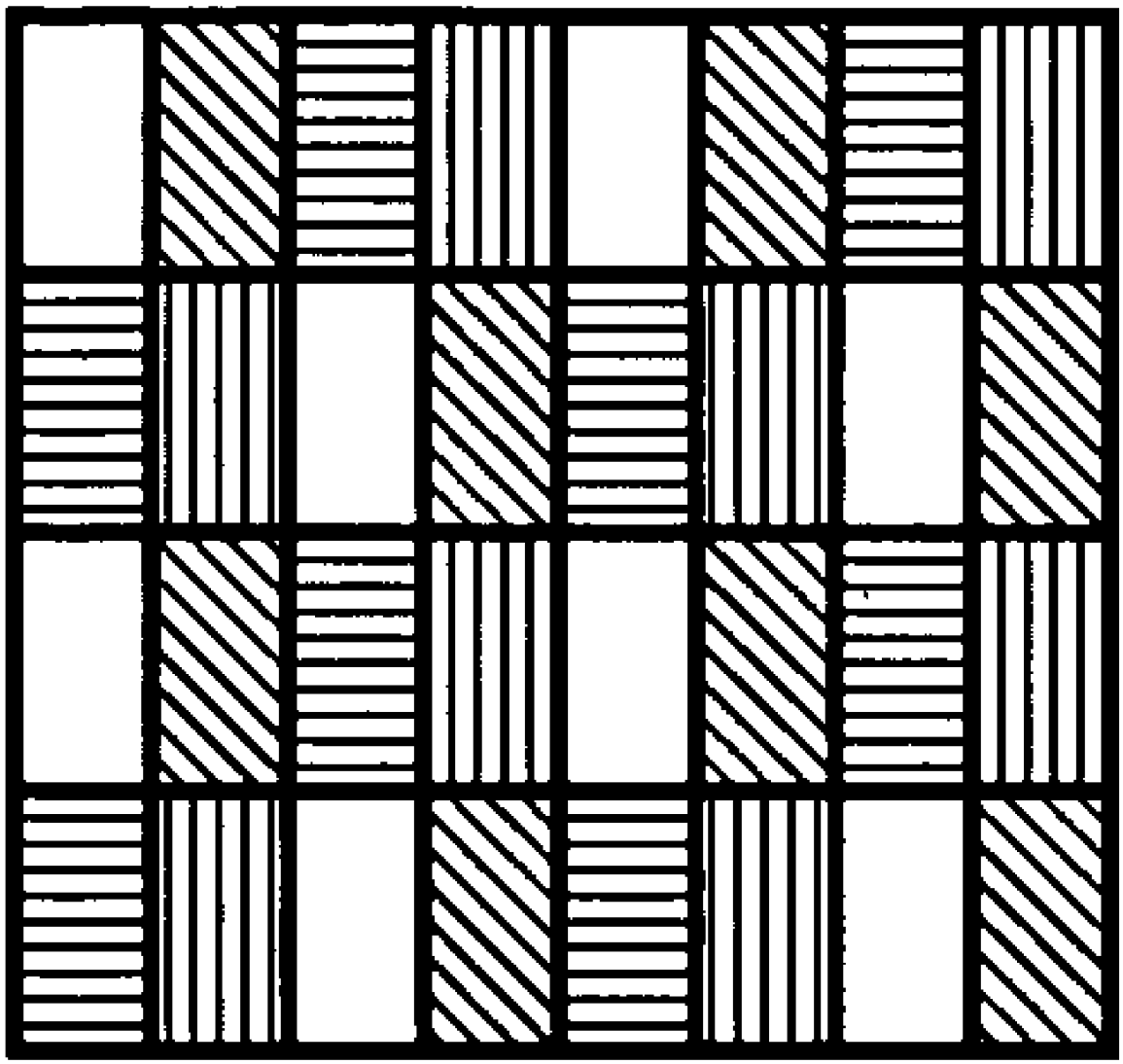
FIG. 25 to 28 are additional embodiments of previous embodiments but shown in mirror image.
Figure 26:
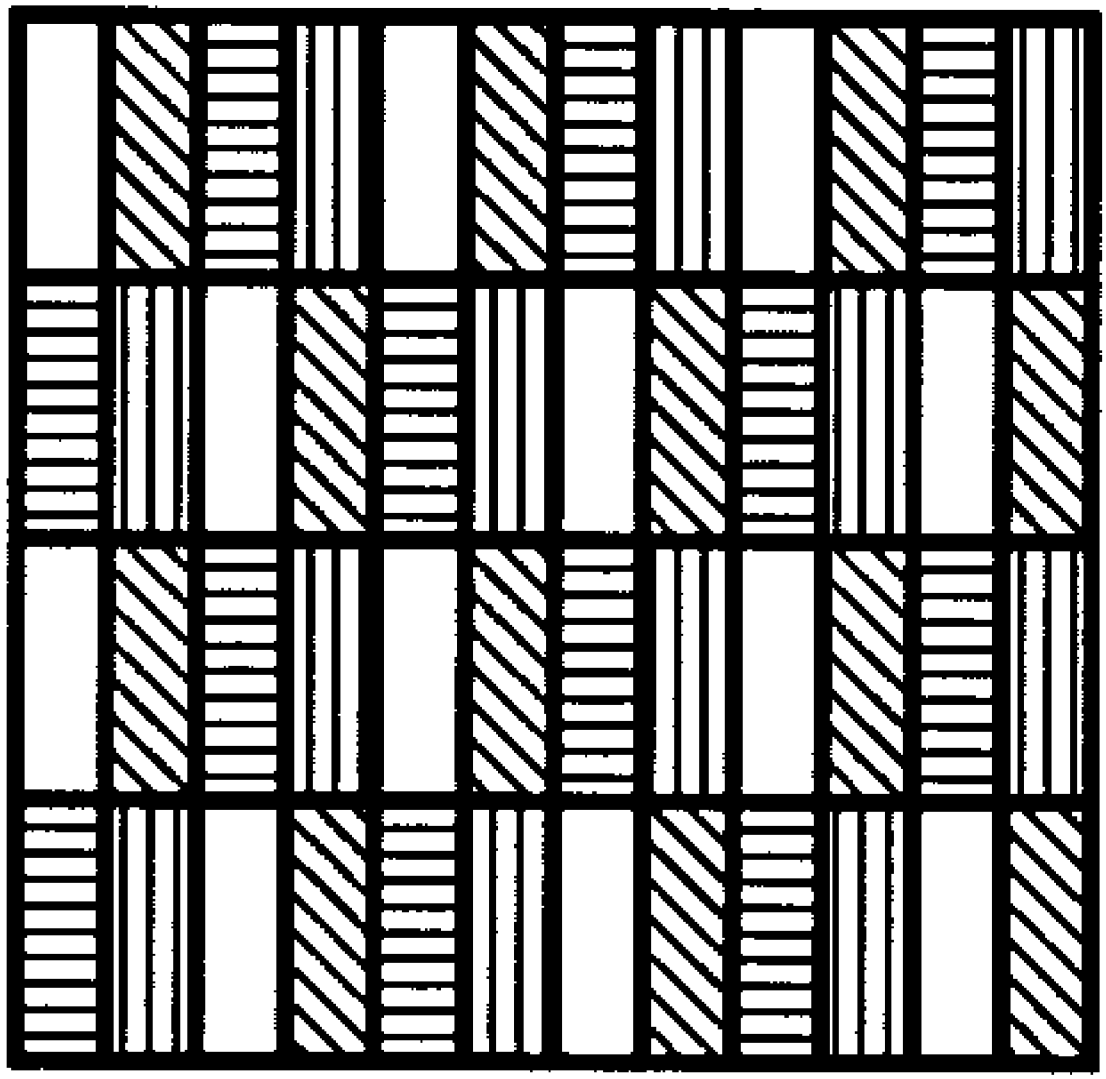
Figure 27:
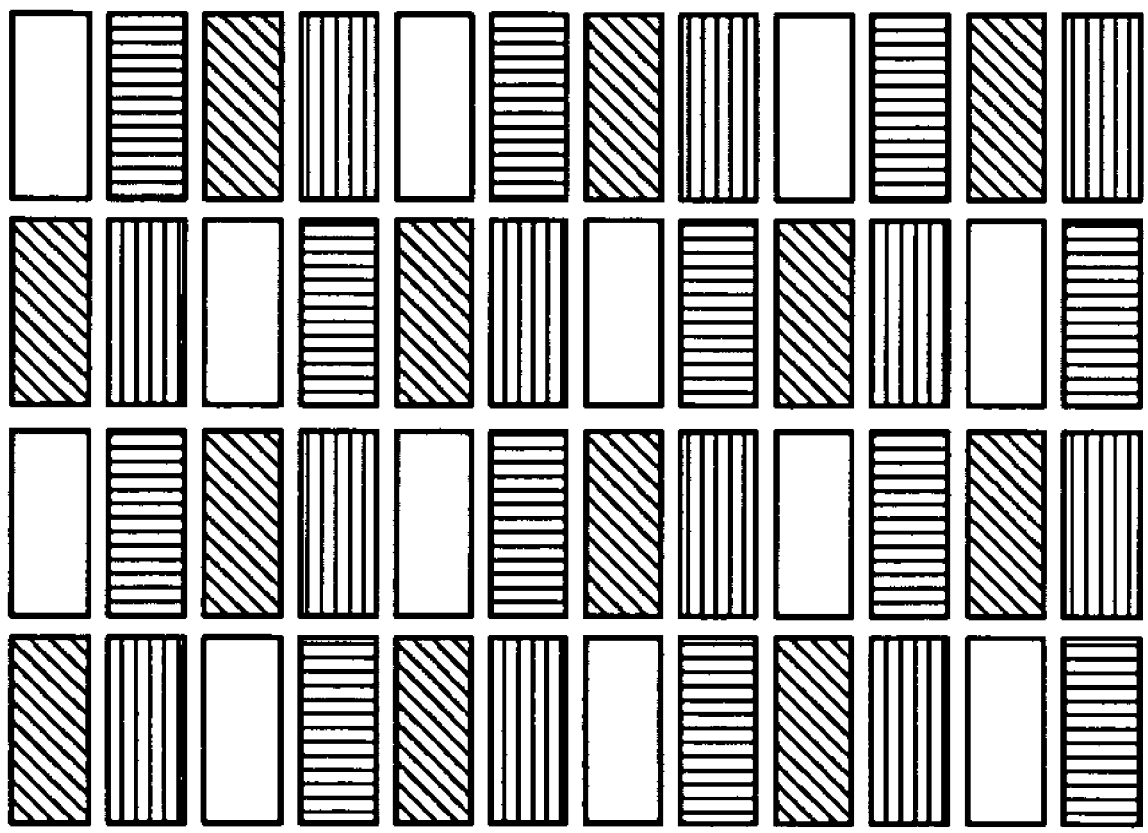
Figure 28:
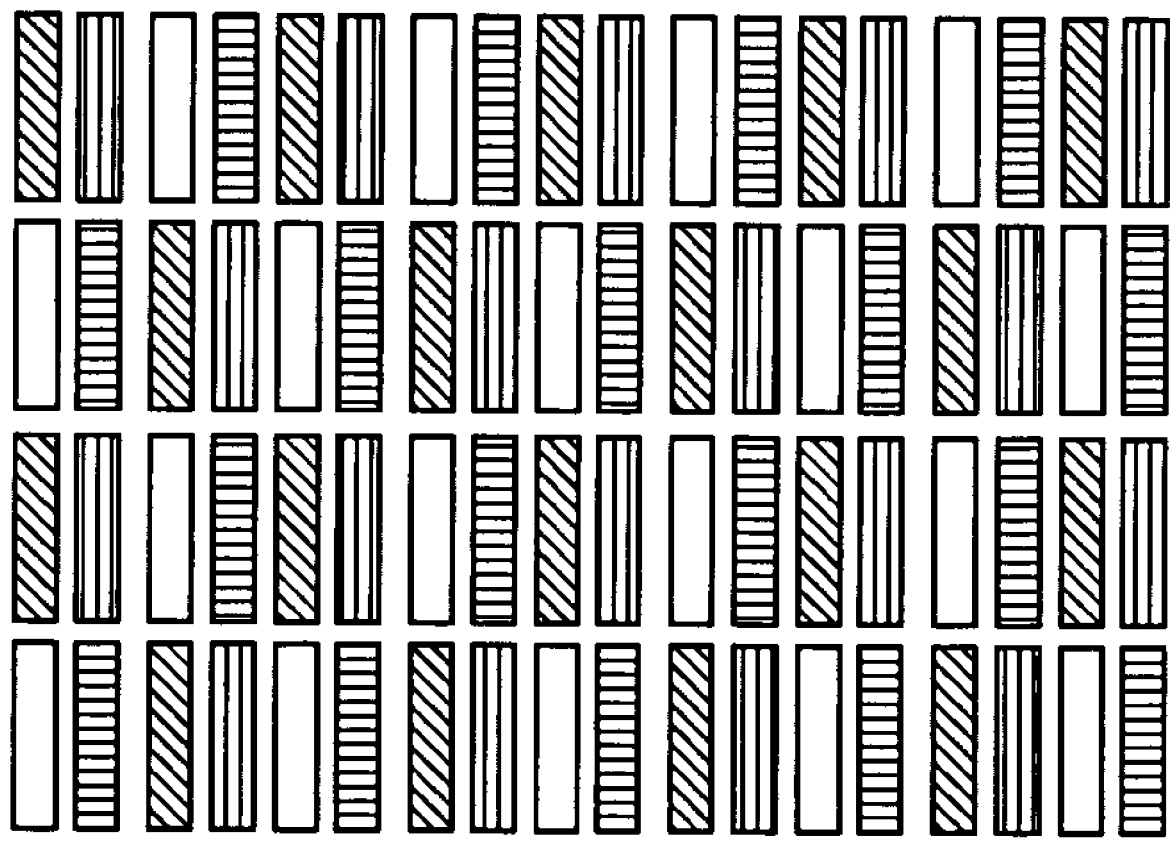

FIG. 17 is another embodiment that is similar to FIG. 11A but wherein the single color planes are placed on a square grid as opposed to a hex grid.

FIGS. 18 through 24 are embodiments of other Figures previously shown herein—but with the white subpixels displaced as shown.

FIGS. 25, 26, 27 and 28 are embodiments of several of Figures previously shown herein—but depicted in mirror image.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A display substantially comprising a subpixel repeating group, said subpixel repeating group comprising one of a first group, said first group comprising one of the following:
   WGBR
   BRWG,
   WBGR
   GRWB,
   WMWC WBWC
   WGWR WGWR
   WCWM WCWB
   WRWG, WRWG,
   WWWW WWWW
   RGCB CBCB
   WWWW WWWW
   CBRG RGRG,
   BWGWR WGWR
   RWBWG WRWG
   GWRWB, WRWG and
   wherein W is substantially white, G is substantially green, R is substantially red, B is substantially blue, C is substantially cyan, and M is substantially magenta color.

2. The display of claim 1 wherein further the white subpixels are substantially of smaller size than the colored subpixels.

3. The display of claim 1 wherein said colored subpixels comprise substantially a first aspect ratio and said white subpixels comprise a second aspect ratio.

4. The display of claim 3 wherein said first aspect ratio is 1:2 and said second aspect ratio is 1:3.

5. The display of claim 4 wherein the backlight output is reduced such that brightness with all subpixels on fully is substantially the same brightness as an RGB stripe panel comprising substantially the same resolution.

6. The display of claim 1 wherein said colored subpixels and said white subpixels comprise substantially the same aspect ratio.

7. The display of claim 1 wherein said subpixels are substantially rectangular shape.

8. The display of claim 1 wherein the repeating subpixel group may comprise one of a second group, said second group further comprising: mirror images of repeating groups comprising said first group; symmetrical transformations of repeating groups comprising said first group and hex grid transformations of repeating groups comprising said first group.

9. The display of claim 1 wherein said display is a liquid crystal display and the black matrix is substantially above the disinclination region.

10. The display of claim 9 wherein the black matrix comprises differentially more area above the disinclination regions for the brighter subpixels.

11. The display of claim 1 wherein said display further comprises a backlight and the color temperature of said backlight adjusted such that a balanced white color is displayed with all subpixels on fully.

12. The display of claim 1 wherein said at least one of the colored filters is selected to be a narrow bandpass filter.

13. The display of claim 1 wherein the white subpixels are vertically displaced substantially 180 degrees with respect to the colored subpixels.

14. A display substantially comprising a subpixel repeating group, said subpixel repeating group comprising one of a first group, said first group comprising one of the following:
   XGXB XCXB XCXM
   XRXG, XRXG, XRXG;
   XRXGXB
   XGXBXR
   XBXRXG,
   RBGX XGBR
   GXRB, BRXG,
   RGBX XBGR
   BXRG, GRXB,
   RGX
   BRG,
   XMXC XBXC
   XGXR XGXR
   XCXM XCXB
   XRXG, XRXG,
   XXXX XXXX
   RGCB CBCB
   XXXX XXXX
   CBRG RGRG,
   BXGXR XGXR
   RXBXG XRXG
   GXRXB, XRXG and
   wherein G is substantially green, R is substantially red, B is substantially blue, C is substantially cyan, and M is substantially magenta color and X is substantially one of a second group, said second group comprising: yellow, grey, blue-grey, and pink.

* * * * *